US012772550B2

(12) United States Patent
Drowley et al.

(10) Patent No.: US 12,772,550 B2
(45) Date of Patent: Oct. 20, 2026

(54) VERTICAL FIN-BASED FIELD EFFECT TRANSISTOR (FINFET) WITH VARYING CONDUCTIVITY REGIONS

(71) Applicant: SEMICONDUCTOR COMPONENTS INDUSTRIES, LLC, Scottsdale, AZ (US)

(72) Inventors: Clifford Drowley, Santa Clara, CA (US); Andrew J. Walker, Santa Clara, CA (US); Andrew P. Edwards, Santa Clara, CA (US); Subhash Srinivas Pidaparthi, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 782 days.

(21) Appl. No.: 18/108,457

(22) Filed: Feb. 10, 2023

(65) Prior Publication Data

US 2023/0260996 A1 Aug. 17, 2023

Related U.S. Application Data

(60) Provisional application No. 63/310,998, filed on Feb. 16, 2022.

(51) Int. Cl.
*H10D 62/85* (2025.01)
*H10D 30/01* (2025.01)
(Continued)

(52) U.S. Cl.
CPC ......... *H10D 84/834* (2025.01); *H10D 30/024* (2025.01); *H10D 30/6211* (2025.01); (Continued)

(58) Field of Classification Search
CPC ............... H10D 84/834; H10D 30/024; H10D 30/6211; H10D 62/8503; H10D 84/0158; (Continued)

(56) References Cited

U.S. PATENT DOCUMENTS

2018/0053824 A1* 2/2018 Wang ................. H10D 30/6211
2022/0013626 A1* 1/2022 Pidaparthi ............ H10D 62/105
2022/0254918 A1* 8/2022 Drowley ................ H10D 30/62

OTHER PUBLICATIONS

Fu, et al., "High Performance Vertical GaN-on-GaN p-n Power Diodes with Hydrogen-Plasma-Based Edge Termination", IEEE Electron Device Letters, vol. 39, No. 7, Jul. 2018, pp. 1018-1021.

(Continued)

*Primary Examiner* — Matthew C Landau
*Assistant Examiner* — Vincent Kipkemoi Rono
(74) *Attorney, Agent, or Firm* — Kevin B. Jackson

(57) ABSTRACT

A vertical fin-based field effect transistor (FinFET) includes an array of FinFETs comprising a plurality of rows and columns of active fins with source contacts and one or more rows of first inactive fins disposed on a first set of sides of the array of FinFETs. The vertical FinFET also includes one or more columns of second inactive fins disposed on a second set of sides of the array of FinFETs. The first inactive fins and the second inactive fins are characterized by a reduced electrical conductivity compared to an electrical conductivity of the active fins of the array of FinFETs. The vertical FinFET further includes an active gate region surrounding the FinFETs of the array of FinFETs and an additional gate region surrounding the first inactive fins and the second inactive fins. At least a portion of the additional gate region is a neutralized gate region.

20 Claims, 19 Drawing Sheets

(51) Int. Cl.
*H10D 30/62* (2025.01)
*H10D 84/01* (2025.01)
*H10D 84/03* (2025.01)
*H10D 84/83* (2025.01)
*H10P 14/20* (2026.01)

(52) U.S. Cl.
CPC ..... *H10D 62/8503* (2025.01); *H10D 84/0158* (2025.01); *H10D 84/038* (2025.01); *H10P 14/3216* (2026.01); *H10P 14/3416* (2026.01)

(58) Field of Classification Search
CPC .. H10D 84/038; H10D 30/025; H10D 30/051; H10D 30/635; H10D 30/831; H10D 62/117; H10D 62/328; H10D 62/343; H10D 84/0135; H10D 84/016; H10D 84/853; H01L 21/02458; H01L 21/0254; H01L 21/26506; H01L 21/2654
See application file for complete search history.

(56) References Cited

OTHER PUBLICATIONS

Han, et al., "High-Voltage and High-On Off Vertical GaN-on-GaN Schottky Barrier Diode with Nitridation-Based Termination", IEEE Electron Device Letters, vol. 39, No. 4, Apr. 2018, pp. 572-575.
Nakamura, et al., "Hole Compensation Mechanism of P-Type GaN Films", Japanese Journal of Applied Physics, vol. 31, May 1992, pp. 1258-1266.

* cited by examiner

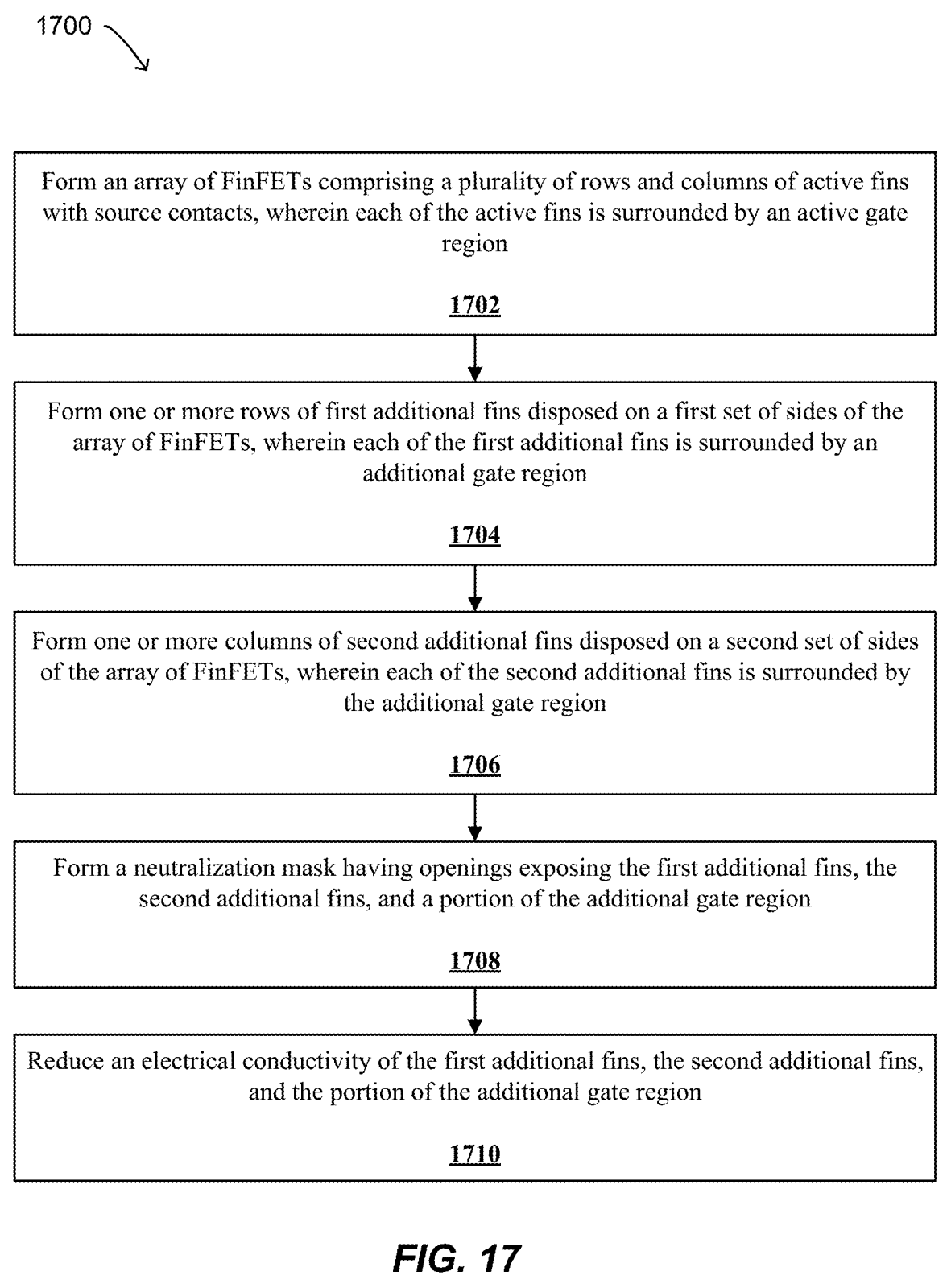

1700

Form an array of FinFETs comprising a plurality of rows and columns of active fins with source contacts, wherein each of the active fins is surrounded by an active gate region

1702

Form one or more rows of first additional fins disposed on a first set of sides of the array of FinFETs, wherein each of the first additional fins is surrounded by an additional gate region

1704

Form one or more columns of second additional fins disposed on a second set of sides of the array of FinFETs, wherein each of the second additional fins is surrounded by the additional gate region

1706

Form a neutralization mask having openings exposing the first additional fins, the second additional fins, and a portion of the additional gate region

1708

Reduce an electrical conductivity of the first additional fins, the second additional fins, and the portion of the additional gate region

1710

*FIG. 17*

VERTICAL FIN-BASED FIELD EFFECT TRANSISTOR (FINFET) WITH VARYING CONDUCTIVITY REGIONS

CROSS-REFERENCES TO RELATED APPLICATIONS

This application claims priority to U.S. Provisional Patent Application No. 63/310,998, filed on Feb. 16, 2022, entitled "Fin-Based Vertical Field Effect Transistor (FinFET) with Varying Conductivity Regions," the disclosure of which is hereby incorporated by reference in its entirety for all purposes.

BACKGROUND OF THE INVENTION

Vertical power transistors, in which the current flows from the top surface of the transistor to the back or bottom surface of the transistor substrate, are commonly used for controlling high currents and high voltages, since they can be formed with a reduced area compared to devices in which current flow through the transistor is lateral.

III-nitride materials, and in particular, gallium nitride (GaN), allow vertical field effect transistor-based power transistors to be fabricated with high breakdown voltages (e.g., in excess of 1200 V) while offering significant reductions in the specific on-resistance (i.e., the on-resistance of the device multiplied by the device area) compared to silicon or silicon carbide materials.

Despite the progress made in the area of vertical power transistors, there is a need in the art for improved methods and systems related to vertical power transistors.

SUMMARY OF THE INVENTION

The present invention generally relates to the field of electronics, including field effect transistor (FET) devices and junction FET (JFET) devices, and more specifically to semiconductor manufacturing technology. In a particular embodiment, structures and methods of forming vertical fin-based FETs (FinFETs) with varying electrical conductivity regions are provided. Embodiments of the present invention are applicable to a variety of different, vertical FET structures and gate configurations.

According to an embodiment of the present invention, a vertical fin-based field effect transistor (FinFET) device is provided. The vertical FinFET device includes an array of FinFETs comprising a plurality of rows and columns of active fins with source contacts, one or more rows of first inactive fins disposed on a first set of sides of the array of FinFETs, and one or more columns of second inactive fins disposed on a second set of sides of the array of FinFETs. The first inactive fins and the second inactive fins are characterized by a reduced electrical conductivity compared to an electrical conductivity of the active fins of the array of FinFETs. The vertical FinFET device also includes an active gate region surrounding the FinFETs of the array of FinFETs and an additional gate region surrounding the first inactive fins and the second inactive fins. At least a portion of the additional gate region is a neutralized gate region.

The first inactive fins and the second inactive fins can comprise ion implanted fins. The first inactive fins and the second inactive fins can comprise neutralized regions formed by plasma treatment. The reduced electrical conductivity can be reduced by at least 90% or 99%. The neutralized gate region can be characterized by a second reduced electrical conductivity compared to a second electrical conductivity of the active gate region. The neutralized gate region can comprise an ion implanted gate region. The neutralized gate region can comprise a neutralized region formed by plasma treatment. The second reduced electrical conductivity can be reduced by at least 90% or 99%. The additional gate region can be the neutralized gate region. The active fins, the first inactive fins, and the second inactive fins can comprise a III-N semiconductor.

According to another embodiment of the present invention, a method of fabricating a transistor array is provided. The method includes forming an array of FinFETs comprising a plurality of rows and columns of active fins with source contacts. Each of the active fins is surrounded by an active gate region. The method also includes forming one or more rows of first inactive fins disposed on a first set of sides of the array of FinFETs. Each of the first inactive fins is surrounded by an additional gate region. The method further includes forming one or more columns of second inactive fins disposed on a second set of sides of the array of FinFETs. Each of the second inactive fins is surrounded by the additional gate region. Additionally, the method includes forming a neutralization mask having openings exposing the first inactive fins, the second inactive fins, and a portion of the additional gate region, and reducing an electrical conductivity of the first inactive fins, the second inactive fins, and the portion of the additional gate region.

Reducing the electrical conductivity can include ion implanting a dopant into the first inactive fins, the second inactive fins, and the portion of the additional gate region. Reducing the electrical conductivity can include performing a hydrogen plasma treatment process on the first inactive fins, the second inactive fins, and the portion of the additional gate region. Reducing the electrical conductivity can include reducing the electrical conductivity by at least 90% or by at least 99%. A portion of the additional gate region can be the additional gate region. The method can also include providing a III-N substrate structure comprising providing a III-nitride substrate, epitaxially growing a first III-nitride layer coupled to the III-nitride substrate, and epitaxially growing a second III-nitride layer coupled to the first III-nitride layer. Forming the array of FinFETs can include forming a hard mask layer on the second III-nitride layer and patterning the hard mask layer to form a patterned hard mask. Forming the array of FinFETs can further include etching the second III-nitride layer and a portion of the first III-nitride layer using the patterned hard mask to form a plurality of trenches and selectively regrowing a third III-nitride layer in the plurality of trenches. The active fins can be characterized by a first electrical conductivity and the first inactive fins and the second inactive fins can be characterized by a second electrical conductivity less than the first electrical conductivity.

Numerous benefits are achieved by way of the present invention over conventional techniques. For example, embodiments of the present invention provide methods and systems that provide uniform dimensions and lower junction leakage in arrays of gate-all-around vertical transistors by providing neutralized fins (i.e., inactive fins with a reduced conductivity). The neutralized fins are not connected to the source electrode, therefore do not contribute to the current carrying capability of the array of gate-all-around vertical transistors. The neutralized fins and the gate regions surrounding the neutralized fins are implanted with neutralizing ions and are characterized by reduced electrical conductivities. As a result, the neutralized fins have a reduced contribution or do not contribute to junction leakage of the transistor array. These and other embodiments of the disclosure, along with many of its advantages and features, are described in more detail in conjunction with the text below and corresponding figures.

BRIEF DESCRIPTION OF THE DRAWINGS

FIG. 17 is a simplified flowchart illustrating a method of forming a transistor array, according to an embodiment of the present invention.

DETAILED DESCRIPTION OF SPECIFIC EMBODIMENTS

Figure 1A:
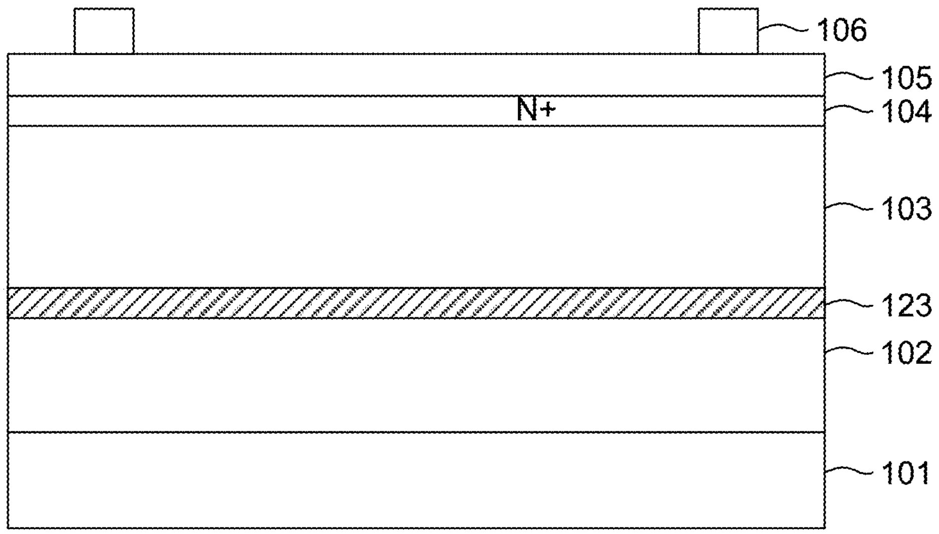
FIGS. 1A-1D illustrate a sequence of formation of an example regrown-gate gate-all-around vertical JFET according to an embodiment of the present invention.

The present invention generally relates to the field of electronics, and more specifically to semiconductor manufacturing technology. In a particular embodiment, structures and methods of forming vertical FinFETs with varying conductivity regions are provided. Embodiments of the present invention are applicable to a variety of different, vertical FET structures and gate configurations.

Power semiconductor devices including transistors and diodes are widely used today in such applications as industrial power supplies, motor drives, consumer electronics, etc. A common application of power semiconductor transistors is their use as switches in switch-mode power supplies or motor drives. In such applications, the ability of the device to operate at high voltages (650V or 1200V, for example) and to withstand momentary overvoltage conditions (line surges or lightning strikes on power lines, for example) are extremely important.

In addition, in order to reduce the resistance of the switch and reduce parasitic capacitances, etc., that limit switch speed, an increased conductance per unit area is desirable. Switch transistors in which the current flow is primarily vertical offer reduced resistance per area. This benefit can be further improved by arranging the control channel of the transistor to lie in the vertical direction, e.g., a "trench" channel transistor. The resistance of the transistor has several components, including the resistance of transistor channel (i.e., the region where current is directly controlled by the input gate voltage), the resistance of the "drift" region (i.e., the region designed to hold the breakdown voltage of the transistor), and the resistance of the starting substrate, contacts, metals, etc.

Transistors with vertical current flow are typically designed with the drain contact at the bottom surface of the chip, and the gate and source contacts at the top surface of the chip.

In order to maximize the switch conductivity (i.e., minimize the switch resistance) and provide a uniform transient response for the device, the transistor may be fabricated using an array of many small, vertical-channel switch devices surrounded by control gates, which can be referred to as an array of "gate-all-around" transistors. The finished device has all sources connected to a single electrode, a common gate electrode, and a drain electrode.

Improvements in switch resistance and capacitance can be made by changing the semiconductor material from silicon to a wide bandgap material such as gallium nitride, which offers a higher critical field for breakdown. Additionally, this change allows the high-voltage drift region of the device to be made thinner and more heavily doped than with similar silicon devices, reducing the "specific resistance" (i.e., the resistance X area) of the drift region, and reduces the device on-resistance for a given die size.

Accordingly, for such wide bandgap transistors, the gate-all-around array has a small area, and is typically fabricated with fine lithographic features (e.g., minimum geometries of <0.5 μm). The control of these features is critical to the uniform operation of the device. For example, if the individual device in the gate-all-around array is a vertical JFET or accumulation-mode MOSFET built on a vertical "fin," variations in the width of the fin can cause significant variation in the individual device leakage or threshold voltage. Such variations impact the overall leakage of the array or the on-resistance of the array, and can affect the maximum voltage or switching efficiency of the device.

Accordingly, methods and systems that provide uniform dimensions in arrays of gate-all-around vertical transistors are described herein.

A vertical FET transistor structure is described in U.S. Pat. No. 9,117,839 (Kizilyalli, et al.) (the "'839 structure"), the disclosure of which is hereby incorporated by reference in its entirety for all purposes. In the '839 structure, the transistor conducting channel is formed using a semiconductor "fin" created by patterning and etching surrounding material to a certain depth. A semiconductor material with an opposite doping type is epitaxially regrown (e.g., using metalorganic vapor phase epitaxy (MOVPE)) to be substantially planar with the top of the semiconductor fin. The regrown material serves as the gate electrode of a vertical FET and application of control voltages to the gate electrode modulates the conduction of current in the vertical fin channel between the top of the fin (i.e., the source) and the bottom of the fin (i.e., normally, the drift region, which is further connected to the drain electrode via the semiconductor substrate).

In the '839 structure, the regrown gate material surrounds the fin. An array of fins can be fabricated with a common gate using this approach, with, for example, fins arranged in a number of rows and columns so that the total number of transistors achieves the desired on-resistance target for the final device.

Dimensional control of the fins is utilized to maintain uniform device characteristics for each individual fin. Fin width control is particularly useful to achieve a narrow threshold voltage and leakage current distribution. Accordingly, methods and systems are provided to achieve the local uniformity of the lithography process that creates the masking layer that defines the fin geometry. Local uniformity of the etch processes that transfer the masking layer pattern into the hard mask and the GaN to create the fin structures are also provided by embodiments of the present invention.

The inventors have determined that the uniformity of both the lithography process and the etch processes can vary significantly between a region with a regular pattern and a region with a sparse pattern. Such a transition occurs at the edges of the array of fins. For example, the presence of a large sparse area next to a regular array can lead to differences in exposure dose due to proximity effects, which will cause the resist linewidth to vary between the center of the array and the edges of the array, with a resulting increase in the electrical variation of the fin devices near the edge of the array. Additionally, the presence of a large sparse pattern area next to a regular pattern array can lead to differences in etch rate caused by variation in the amount of etchant consumed in the sparse pattern region vs. the amount consumed in the regular pattern array. Such differences in etch rate can affect both fin width and fin height, with a resulting increase in the electrical variation of the fin devices near the edge of the array.

In addition, the inventors have determined that the uniformity of the regrown-gate process may be dependent on the local pattern density in the array as discussed in U.S. Patent Application Publication No. 2021/0210624, the disclosure of which is hereby incorporated by reference in its entirety for all purposes. The regrown-gate process in the '839 patent uses a selective area regrowth, where the top of the fins is protected by a hard mask. GaN does not grow on the hard mask, and the gallium-containing species that arrive on the hard mask diffuse to the exposed GaN surrounding the hard mask, thereby enhancing the epitaxial growth rate in the array relative to the growth rate on a uniform GaN surface such as is found outside the array. Such variations in the growth rate can lead to non-uniform height of growth on the fin sidewalls, which will affect the effective channel length of the switch, and can cause variation in leakage current at high voltage and in threshold voltage, for fins near the edges of the array. Variation in the growth rate may also affect the uniformity of dopant incorporation in the GaN during regrowth, which in turn can cause variation in threshold voltage.

Similarly, the local incorporation rate of dopant species in the regrown gate (or through the use of a gas-phase doping technique, e.g., as described in U.S. Patent Application Publication No. 2022/0254918, the disclosure of which is hereby incorporated by reference in its entirety for all purposes, can be affected by the presence of a local mask or local topography. Doping of the regrown gate using a Mg-containing species (e.g., bis(cyclopentadienyl)magnesium (Cp2Mg)) can vary near the edge of the array, causing local variations in threshold voltage or leakage characteristics of the vertical devices in that region.

Therefore, methods and structures that can improve uniformity of lithography control, etch control, and regrowth control (if used) to ensure uniform device characteristics for the individual vertical fin-based transistors in the array are provided by embodiments of the present invention and described herein.

As described more fully herein, in some embodiments, an array of fins is created in a second epitaxial layer disposed on a first epitaxial layer on a substrate, to form a vertical power device, as described, for example, in U.S. Pat. No. 11,335,810 and U.S. Patent Application Publication No. 2022/0020743, the disclosures of which are hereby incorporated by reference in their entirety for all purposes. The array is arranged in a regular pattern of rows and columns. For the discussion below, the fins are assumed to be rectangular in plan view, with the long axis arranged in the direction of the column (i.e., the y-direction) and the narrow axis arranged in the direction of the row (i.e., the x-direction). Various other arrangements of the fin array are possible, for example, as discussed in U.S. Patent Application Publication No. 2021/0210624, the disclosure of which is hereby incorporated by reference in its entirety for all purposes. In an embodiment, the conductivity type of the first and second epitaxial layers and the substrate are n-type.

According to embodiments of the present invention, the array is designed to include one or more extra fins (i.e., inactive fins) at the ends of each row, and one or more extra fins (i.e., inactive fins) at the top and bottom of each column, thereby providing an excess number of fins compared to the number of fins utilized to achieve the desired on-resistance and current capacity for the transistor array. In some embodiments, the number of extra fins at each end of a row is between one and ten. In an embodiment, the number of extra fins at each end of a row is five. In an embodiment, the extra fin at the top and bottom of each column is shorter in the y-direction than the other fins in the column. These extra fins can be referred to as inactive fins, additional fins, extra fins, or dummy fins.

The methods provided according to embodiments of the present invention can also include forming a gate region around the fins using one of several methods. Forming the gate region can include regrowing an epitaxial layer in the region between the fins, as described in U.S. Pat. No. 11,335,810 and U.S. Patent Application Publication No. 2022/0020743. In some embodiments, this epitaxial layer is p-GaN. Forming the gate region can include implanting a gate region in the region between the fins (and optionally, in the sidewalls of the fins), where the conductivity type of the gate region is opposite that of the first and second epitaxial layers. In an embodiment, the gate region is p-type. These implantation methods are discussed in U.S. Pat. No. 11,575,000 and U.S. Patent Application Publication Nos. 2021/0407815 and 2022/0254918, the disclosures of which are hereby incorporated by reference in their entirety for all purposes. Forming the gate region can further include diffusing a gate region in the region between the fins (and optionally, in the sidewalls of the fins), where the conductivity type of the gate region is opposite that of the first and second epitaxial layers. In an embodiment, the gate region is p-type. In an embodiment, the dopant is diffused from a solid source. In an embodiment, the dopant is diffused from a gas-phase source. In an embodiment, the dopant is one of Mg, Zn or Be. These diffusion methods are discussed in U.S. Pat. No. 11,575,000 and U.S. Patent Application Publication Nos. 2021/0407815 and 2022/0254918.

FIGS. 1A, 1B, 1C, and 1D illustrate a sequence of formation of an example regrown-gate gate-all-around vertical JFET according to an embodiment of the present invention. Further details are provided in U.S. Pat. No. 11,335,810 and U.S. Patent Application Publication No. 2022/0020743, the disclosures of which are hereby incorporated by reference in their entirety for all purposes.

Referring to FIG. 1A, a substrate 101, for example, an N+ doped III-nitride substrate, is illustrated. A first semiconductor layer 102, for example, an N− doped semiconductor (drift) layer, is epitaxially grown on substrate 101 at a temperature between 950 and 1200° C., preferably between 1000 and 1150° C., and more preferably about 1100° C. A second semiconductor layer 103, e.g., an N doped semiconductor layer, is epitaxially grown on first semiconductor layer 102 at a temperature between 950 and 1200° C., preferably between 1000 and 1150° C., and more preferably about 1100° C. Referring to FIG. 1A, a metal layer 105 is formed on second semiconductor layer 103, and a patterned hard mask layer 106 is formed on metal layer 105. In an embodiment, a hard mask layer may include $Si_3N_4$ and is formed with a thickness of about 400 nm by plasma enhanced chemical vapor deposition (PECVD) at about 300° C. In an embodiment, patterned hard mask layer 106 may be formed using RIE with F-based chemistry. In an embodiment, metal layer 105 is omitted.

In an embodiment, substrate 101 is an N+ doped III-nitride substrate that is heavily doped with N-type dopants in a dopant concentration in a range of about $5\times10^{17}$ atoms/cm$^3$ to about $1\times10^{19}$ atoms/cm$^3$ and a resistivity of less than 0.020 ohm-cm. In one embodiment, the resistivity of the N+ doped III-nitride substrate may be from about 0.001 ohm-cm to 0.018 ohm-cm, preferably less than 0.016 ohm-cm, and more preferably, less than 0.012 ohm-cm. First semiconductor layer 102 is a drift layer having a thickness of about 12 μm and a dopant concentration in a range of about $1\times10^{16}$ atoms/cm$^3$. Second semiconductor layer 103 is a fin conduction layer having a uniform doped region with N-type dopants of about $1.3\times10^{17}$ atoms/cm$^3$ and a thickness of about 12 μm. In the embodiment illustrated in FIG. 1A, a graded doping region 123 having a thickness of about 0.3 μm is disposed between the first and second semiconductor layers and has a dopant concentration that increases (e.g., linearly) from about $1\times10^{16}$ atoms/cm$^3$ to $1.3\times10^{17}$ atoms/cm$^3$, i.e., from the first semiconductor layer toward the second semiconductor layer. Metal layer 105 may include TiN, and patterned hard mask layer 106 may include silicon nitride. In one embodiment, a heavily N+ doped layer 104 may be present between second semiconductor layer 103 and metal layer 105 to improve contact resistance between the second semiconductor layer and the metal layer. Thus, additional layers can be inserted between the illustrated layers as appropriate to the particular application. In the following drawings and figures, graded doping region 123 and heavily N+ doped layer 104 are omitted for the sake of clarity.

Figure 1B:
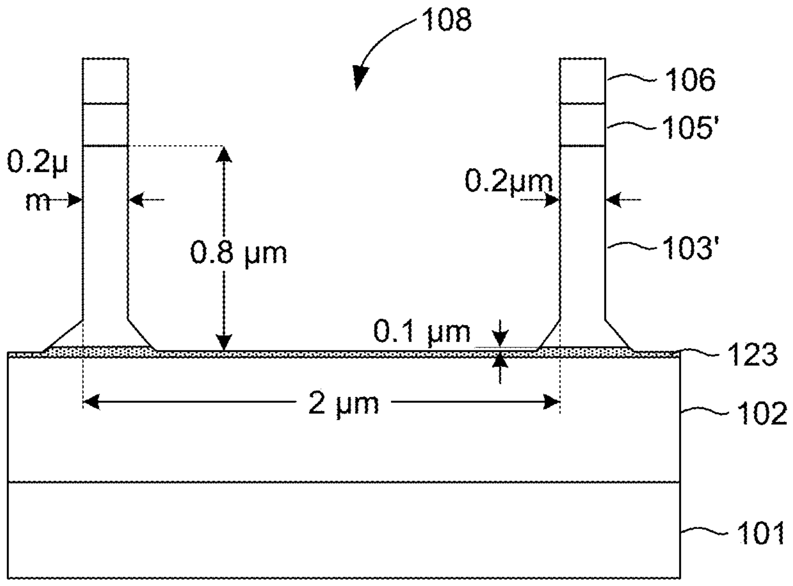

Referring to FIG. 1B, an etch process is performed using the patterned hard mask layer 106 as a mask to form a plurality of fins 103' and source contacts 105', e.g., patterned metal contacts In some embodiments, the fins each have a width of about 0.2 μm and a height in a range between about 0.7 μm and 0.8 μm, and are spaced apart from each other by a space of about 2 μm, i.e., the fin pitch is about 2 μm. To achieve uniform height of the fins, good controllability of the depth of the etch process is utilized. An etch process may include Cl-based chemistry using a reactive ion etch (RIE) process and be carried out to remove a portion of second semiconductor layer 103 to form a recess region 108. In an embodiment, the etch process may stop when about 0.1 μm of graded doping region 123 is removed. The use of the graded doping region to mitigate the electrical effects of the etch process variation or tolerance is beneficial as will be described in detail further below.

It is noted that the bottom portion of the fins may have a shape different form the shape shown in FIG. 1B after the etch process. Embodiments are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the following drawings, the bottom portion of the fins is shown as having a 90 degrees angle with the surface of the graded doping region, i.e., the fins are shown as having a cross-sectional rectangular shape. It is understood that the bottom portion of the fins may have rounded or curved features. Thus, the regions illustrated in the figures are schematic in nature and their shapes are not intended to illustrate the actual shape of a region of a device and are not intended to limit the scope of the invention.

In one embodiment, after forming the trench (i.e., recess region 108), a cleaning process is carried using a tetramethylammonium hydroxide (TMAH) solution of about 25% by weight, at a temperature of about 85° C., and for a duration of about 30 minutes. In another embodiment, prior to performing a cleaning using the TMAH solution, a pre-cleaning such as piranha clean using a $H_2SO_4$:$H_2O$ in a volume ratio 2:1 for 2 minutes may also be performed.

Figure 1C:
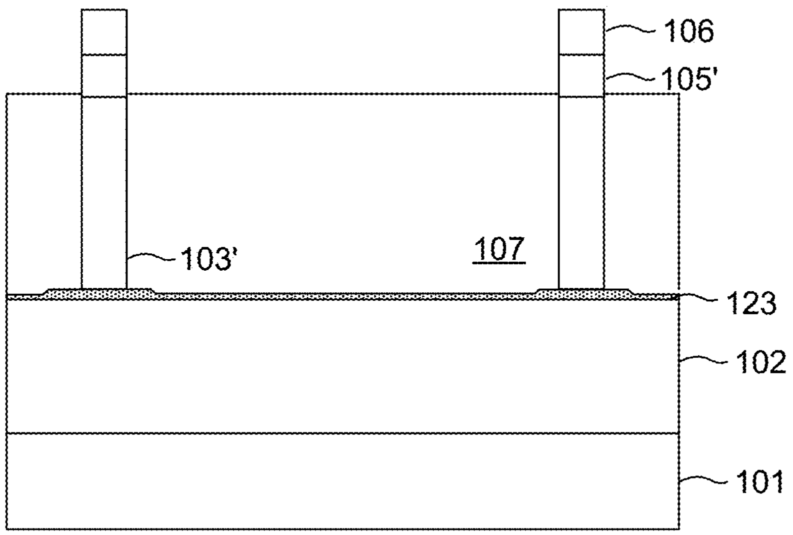

Referring to FIG. 1C, after the cleaning, a third semiconductor layer 107 is epitaxially grown in recess region 108. In an embodiment, third semiconductor layer 107 may include a p-type GaN layer that is grown non-conformally in the trench at a temperature of about 950° C. up to a thickness that is substantially planar to the bottom of source contacts 105' (or patterned hard mask layer 106, if source contacts 105' are omitted). In one embodiment, the thickness of third semiconductor layer 107 is about 840 nm. The p-type GaN layer may be doped with Mg with a dopant concentration of about $1\times10^{19}$ atoms/$cm^3$. The p-type GaN layer may be doped with Mg with a dopant concentration of about $1\times10^{19}$ atoms/$cm^3$. Thereafter, a thermal anneal (e.g., a rapid thermal annealing in $N_2$ at 850° C. for 5 minutes) is performed to activate the Mg dopant atoms. The Mg atoms are then activated in the p-type GaN layer in an amount of greater than 10% by weight. In one embodiment, a heavily N+ doped layer (as shown in FIG. 1A) may be present between fins 103' and source contacts 105' to improve contact resistance between the second semiconductor layer and the metal layer.

Figure 1D:
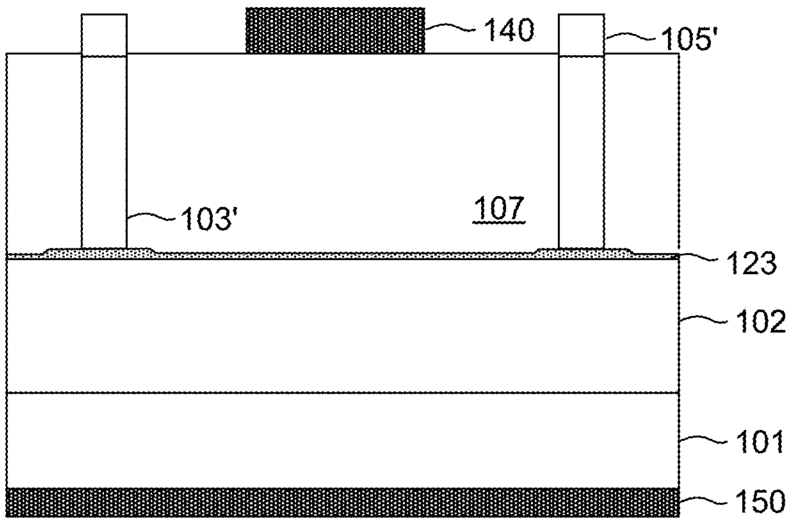

Referring to FIG. 1D, patterned hard mask layer 106 has been removed, exposing source contacts 105', which serve as source contacts, and gate metal 140 is formed on third semiconductor layer 107, thereby serving as gate contacts. Drain metal 150 is formed on substrate 101 to provide a drain contact and enable FET functionality.

Figure 2:
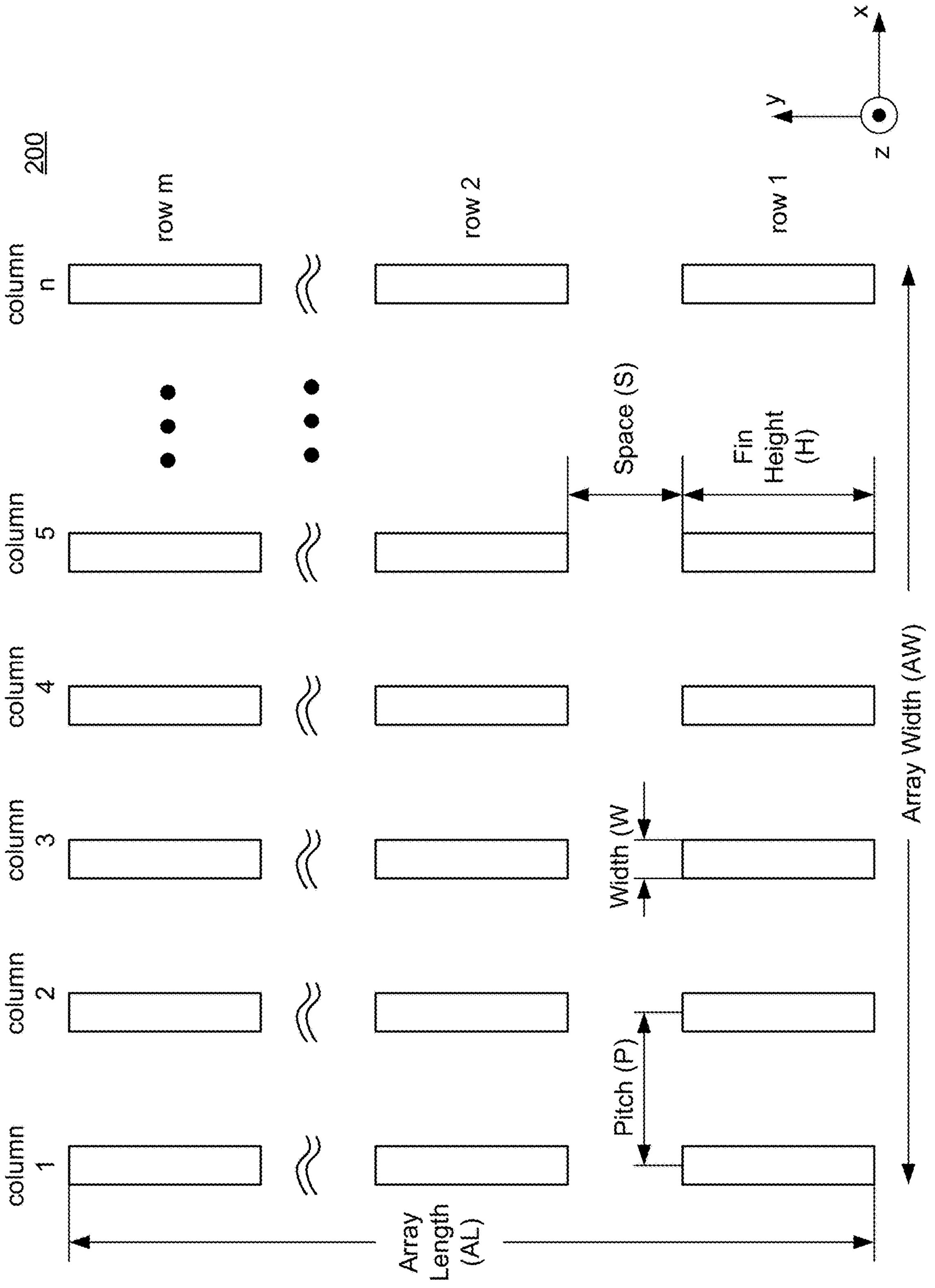
FIG. 2 illustrates an example of an array layout according to an embodiment of the present invention.

FIG. 2 illustrates an example of an array layout according to an embodiment of the present invention. In FIG. 2, a plan view of a fin pattern layout is illustrated including a fin array 200 having a plurality of semiconductor fins arrayed in rows. As illustrated in FIG. 2, the fins are bar-shaped fins, for example, with a length smaller than or equal to 100 μm, 50 μm, 25 μm, or the like. Referring to FIG. 2, fin array 200 includes a plurality of fins arranged in a plurality of rows (row 1, row 2, row 3) and in a plurality of columns (column 1, column, 2, . . . , column n). The fins in each row are separated from each other by a pitch P. Each row is separated from each other by a space S (i.e., the gap between each row). The total length of the array is now related to the individual fin length L, the number of rows N, and the space S by AL=N*L+(N−1)*S. In one embodiment, the space S has a size equal to the pitch P. In another embodiment, the space S can have a size greater than a single pitch P (e.g., 1.2×P, 1.5×P, or 2×P). It is understood that the number of rows and the number of columns can be any integer number. In one embodiment, the number of columns in different rows may be different, for example, to enable "rounding" of the array for improved junction-terminated edge designs. In the example shown in FIG. 2, six fins are used in each row, and three rows and six columns are shown, but it is understood that the number of fins and the number of rows and columns are arbitrarily chosen for describing the example embodiment and should not be limiting.

In one exemplary embodiment, the fin length L is about 25 μm, the fin width W is about 0.2 μm, the fin thickness or fin height measured along the z-direction is about 0.8 μm, the pitch P is in the range between 1.5 μm and 2.5 μm. In one embodiment, a ratio between a fin width W and a pitch P between two adjacent fins is in the range between about 0.08 and 0.13, preferably in the range between 0.1 and 0.12. In one embodiment, a ratio between a fin length L and the pitch P between two adjacent fins is in the range between 5 and 25, preferably between and 20, and more preferably between 12 and 16. In one embodiment, the fin length L is about 25 μm and the fin width W is in the range between 0.15 μm and 0.7 μm.

In operation, the fins will form the channels of the FinFET and the gate metal will be deposited between adjacent fins. As a result, the design illustrated in FIG. 3 can be referred to as a "gate-all-around" design in which the gate surrounds the fins. In FIG. 2, for purposes of clarity, the gate metal in the gate region surrounding the fins in the array of fins is not shown. Additional description related to arrays of fins, including other layout concepts, is provided in U.S. Patent Application Publication No. 2021/0210624, the disclosure of which is hereby incorporated by reference in its entirety for all purposes.

Figure 3A:
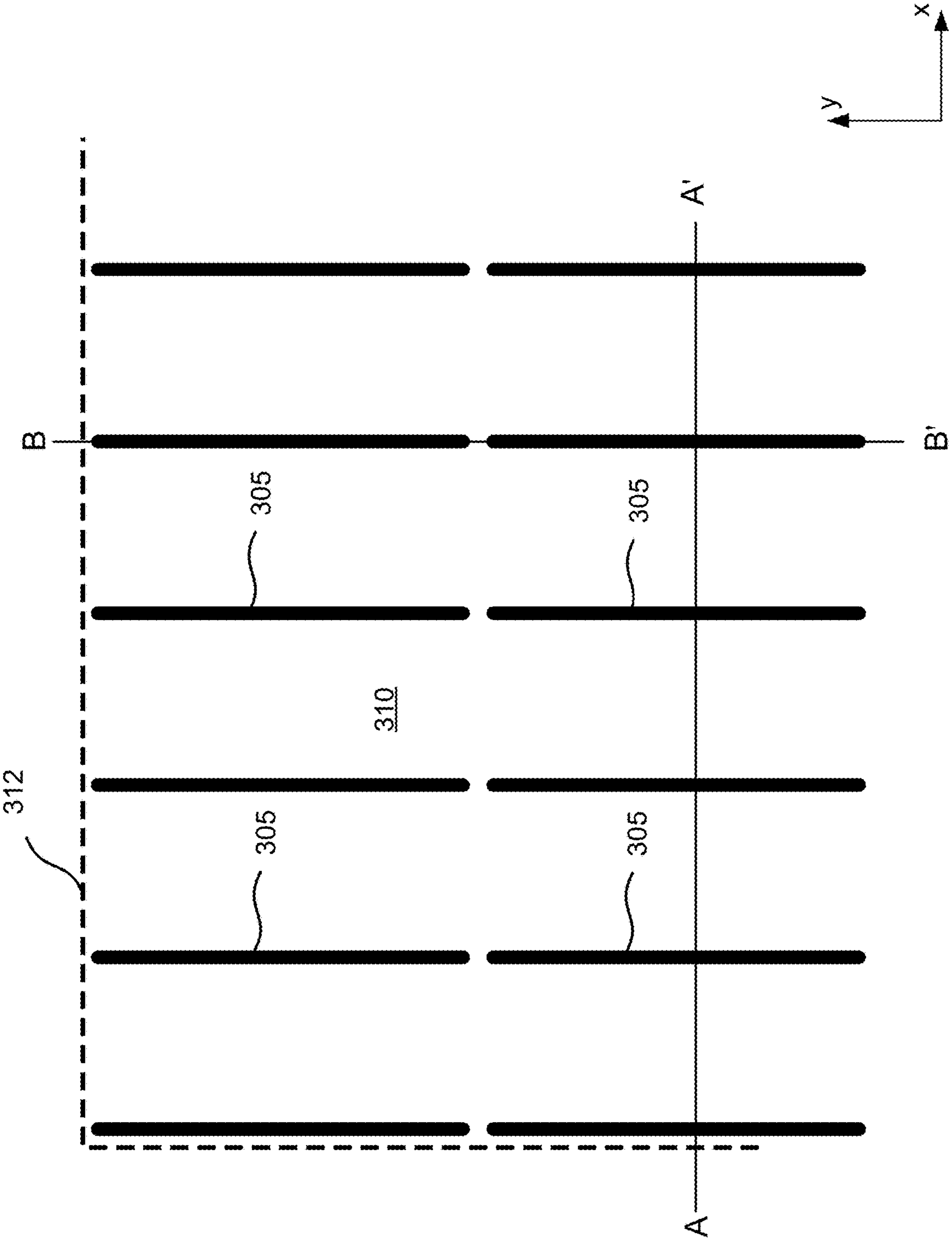
FIG. 3A illustrates a plan-view layout of an array of fins in an active area according to an embodiment of the present invention.
Figure 3B:
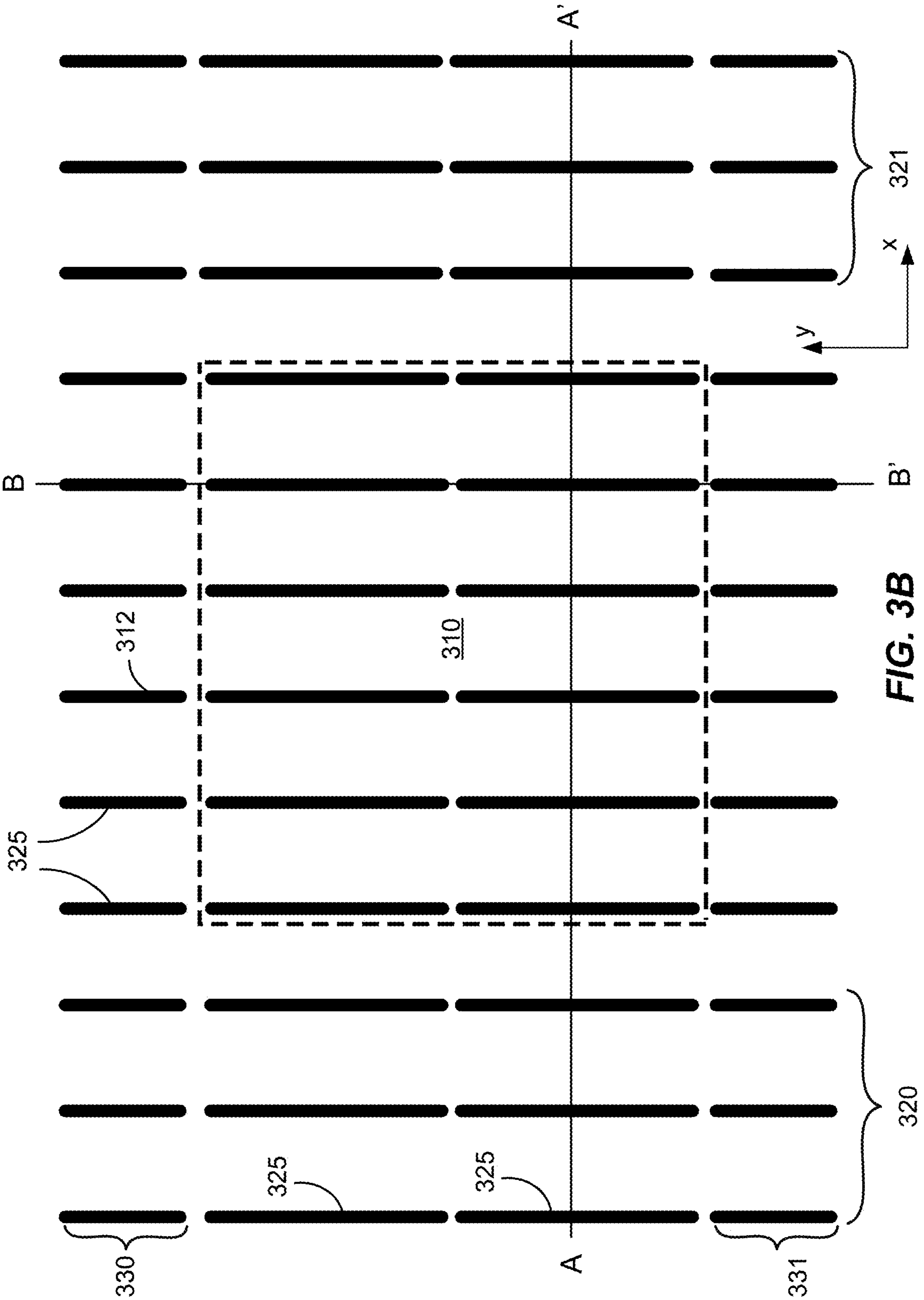
FIG. 3B illustrates a plan-view layout of the array of fins in the active area shown in FIG. 3A and inactive fins according to an embodiment of the present invention.

FIG. 3A illustrates a plan-view layout of an array of fins in an active area according to an embodiment of the present invention. FIG. 3B illustrates a plan-view layout of the array of fins in the active area shown in FIG. 3A and inactive fins according to an embodiment of the present invention.

In FIG. 3A, an active fin array 310 is illustrated. The boundary 312 of the active fin array 310 is also illustrated. The active fin array 310 includes a plurality of fins 305 arranged in a two-dimensional array. For purposes of clarity, only two rows of fins, each including six fins, are illustrated, but it will be appreciated that the array dimensions are not limited to this example.

As described above and more fully in relation to FIGS. 3A and 3B, the inventors have found that the local uniformity of the growth (e.g., the uniformity of the thickness of the regrowth between fins from gate region to gate region) is impacted by edge effects present at the boundary 312 of the active fin array 310. Accordingly, embodiments of the present invention improve regrowth uniformity and enable the fabrication of an active fin array with uniform gate regrowth. Achieving uniform gate regrowth enables minimum variation in channel length (i.e., the length of the channel extending along the z-direction aligned with the thickness of the fins in the fin array across a large area). In some embodiments, the fin array can extend more than one millimeter in the x-direction and/or the y-direction, and use of the methods and structures described herein can result in regrowth non-uniformity of <2% of the nominal regrowth thickness, i.e., a variation in regrowth thickness of <15 nm for fins of nominal thickness of 0.75 μm.

In addition to regrowth thickness uniformity, improvements in fin width uniformity are provided by embodiments of the present invention. At the boundary 312 of the active fin array 310, the amount of photoresist developer outside the active fin array is different than the amount of photoresist developer inside the active fin array, resulting in a gradient of developer across the active fin array 310. In conditions in which the developer concentration is lower inside the active fin array in comparison with outside the active fin array, the linewidth of the fin definition mask, e.g., the patterned hard mask or patterned metal mask, can vary. This will result, during the fin definition process, in differences in the fin critical dimension (CD) near the edges of the active fin array compared to the center of the active fin array. Moreover, the etch process can be impacted by edge effects. During etching of the gate trench, a large area outside the active fin array is etched in comparison to a smaller area inside the active fin array. As a result, the etch loading will vary near the edges of the active fin array, resulting in variations in the etch rate and, as a result, variation in the depth of the gate trench across the active fin array. Variation in the depth of the gate trench can then result in variation in the uniformity of the thickness of the regrown material disposed between fins.

Referring to FIG. 3B, the addition of one or more inactive fin columns 320 on a first side of active fin array 310 as well as one or more inactive fin columns 321 on a second side of active fin array 310 opposing the first side and one or more inactive fin rows 330 on a third side of active fin array 310 and one or more inactive fin rows 331 on a fourth side of active fin array 310 opposing the third side results in an increase in regrowth uniformity, active fin CD, and uniform gate trench etch depth in the active fin array 310. The regrowth uniformity enabled by embodiments of the present invention mitigates a number of adverse consequences that would otherwise result from regrowth non-uniformity. These adverse consequences can include: the gate metal layer having different thicknesses for different gates, which causes the metal gate resistivity to vary; unequal channel lengths that cause a high concentration of the current on the short regrown gate area (e.g., a hot spot) that may exceed the maximum permissible temperature value and reduce the device reliability; uneven topography for self-aligned contacts; and higher leakage current.

Referring to FIG. 3B, an array of fins with both an active fin array 310, which will typically have many more active fins than illustrated, and inactive fins is illustrated. In FIG. 3B, the inactive fins 325, which can also be referred to as extra, additional, or dummy fins, are arranged in multiple columns to the left (inactive fin columns 320) and right (inactive fin columns 321) of the active fin array 310 and in one row to the top (inactive fin row 330) and bottom (inactive fin row 331) of the active fin array 310. In FIG. 3B, three inactive fins make up inactive fin column 320, three inactive fins make up inactive fin column 321, one row of inactive fins make up inactive fin row 330, and one row of inactive fins make up inactive fin row 331, but the number of inactive fin columns and inactive fin rows can be greater than the number illustrated in FIG. 3B. Similarly, the number of rows and columns of active fins in the active fin array 310 can also be greater than illustrated. As described more fully in relation to FIGS. 6 and 8, the inactive fins in the inactive fin columns 320/321 and the inactive fin rows 330/331 do not include source contacts and do not participate in the current flow occurring in the active fin array 310 during operation. However, the inactive fins result in improvements in regrowth uniformity that lead to improved device performance of the FinFETs in the active fin array 310.

Although the inactive fins in the inactive fin columns 320/321 have the same fin width and fin pitch as the active fins in the active fin array 310, this is not required by the present invention and the fin width and the fin pitch in the inactive fin columns 320/321 can differ from that in the active fin array 310. As an example, the pitch of the inactive fins in the inactive fin columns 320/321 could not only be different than the pitch in the active fin array 310, but the pitch could vary across the inactive fin columns 320/321. Additionally, the inactive fins in the inactive fin columns 320/321 can have different fin heights than the active fins in the active fin array 310. Moreover, the inactive fins in the inactive fin row 330/331, although they are illustrated as having the same fin width and fin pitch as the active fins in the active fin array 310, do not have to have the same fin width and the fin pitch as the active fins in the active fin array 310. Additionally, the inactive fins in the inactive fin row 330/331 can be offset along the x-direction with respect to the active fins in the active fin array 310, providing a variation on the embodiment illustrated in FIG. 3B, in which the inactive fins are aligned with the active fins. One of ordinary skill in the art would recognize many variations, modifications, and alternatives.

Irregular edges (e.g., fitting the array to a circular arc of an edge termination) may be accommodated by, for example, "stair-stepping" the active fin array boundary with appropriate combinations of additional rows of inactive fins and additional columns of inactive fins.

Figure 4:
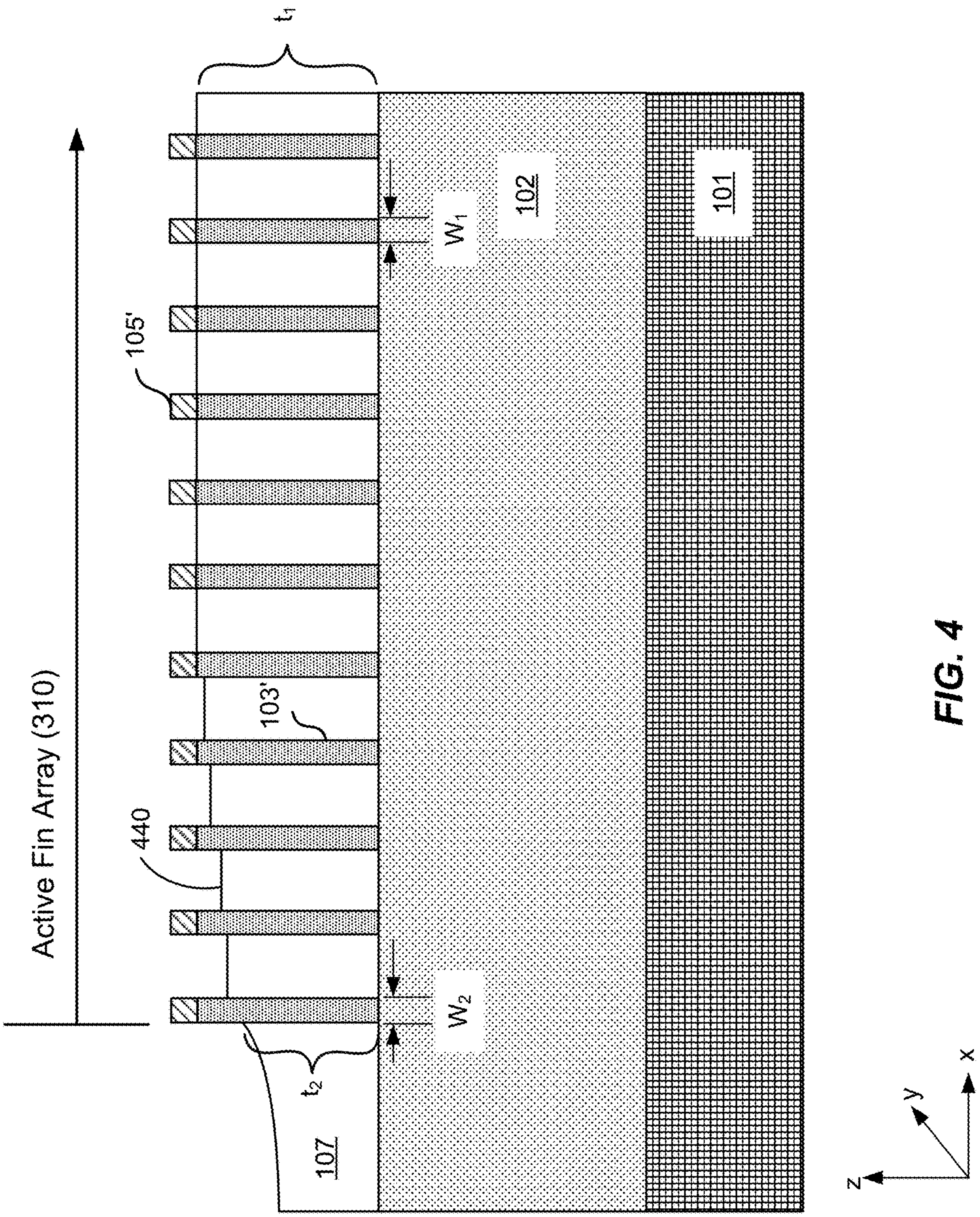
FIG. 4 is a cross-section drawing of the array of fins in the active area shown in FIG. 3A along a first direction according to an embodiment of the present invention.

FIG. 4 is a cross-section drawing of the array of fins in the active area shown in FIG. 3A along a first direction according to an embodiment of the present invention. FIG. 4 illustrates regrowth non-uniformity corresponding to the array of fins in an active fin array according to an embodiment of the present invention. In FIG. 4, the cross-section is taken along direction A-A' shown in FIG. 3A. As illustrated in FIG. 4, elements discussed in relation to FIGS. 1A-1D are shown, including substrate 101, first semiconductor layer 102, fins 103' formed from second semiconductor layer 103 illustrated in FIG. 1A, and third semiconductor layer 107, i.e., the regrown p-type GaN layer serving as the gate. Source contacts 105' are illustrated. A number of non-uniformities in the fin array due to edge effects can be present in the cross-section illustrated in FIG. 4, including irregular or incomplete p-GaN gate growth, irregular p-GaN gate dopant incorporation, and variation in fin dimensions.

Referring to FIG. 4, the thickness of the third semiconductor layer 107, also referred to as the regrown p-GaN gate, varies as a function of lateral dimension (i.e., along the x-direction) due to edge effects at the edge of the fin array. The thickness varies from thickness $t_1$ at portions of the fin array adjacent the center of the fin array to thickness $t_2$ at the edge of the fin array. Although the decrease in thickness is illustrated as step 440, it will be appreciated that FIG. 4 is merely a schematic diagram and the thickness variation can be present in other morphologies. In some embodiments, as illustrated in FIG. 4, the regrowth thickness decreases near the edge of the fin array, for example, resulting in a concave regrowth surface, with the thinnest portion of the regrowth positioned between adjacent fins. In other embodiments, the regrowth thickness increases near the edge of the fin array, resulting in overgrowth to thicknesses higher than the fin thickness. Although it is not illustrated in FIG. 4, variation in gate trench depth can also be present.

In addition to regrowth thickness non-uniformity, the regrown material may also be characterized by variation in doping concentration. Because regrowth rates are different on different planes of the GaN hexagonal crystal, for example, the m-planes and the c-planes, the dopant incorporation can vary depending on the growth plane.

Moreover, in addition to regrowth thickness, the fin width can vary as a function of lateral dimension (i.e., along the x-direction). As illustrated, in FIG. 4, the fin width, which, as discussed above, is defined, in part, by the dimension of the mask used to etch the gate trenches, varies from width $W_1$ adjacent the center of the fin array to width $W_2$ at the edge of the fin array. Although a decrease in fin width is illustrated in FIG. 4, it will be appreciated that the fin width variation can be present in other manners. In some embodiments, as illustrated in FIG. 4, the fin width decreases near the edge of the fin array, whereas, in other embodiments, the fin width increases near the edge of the fin array.

Thus, FIG. 4 illustrates potential issues associated with the edge region of the array, including irregular or incomplete p-GaN gate growth, irregular p-GaN gate dopant incorporation, and variation in fin dimensions.

Figure 5:
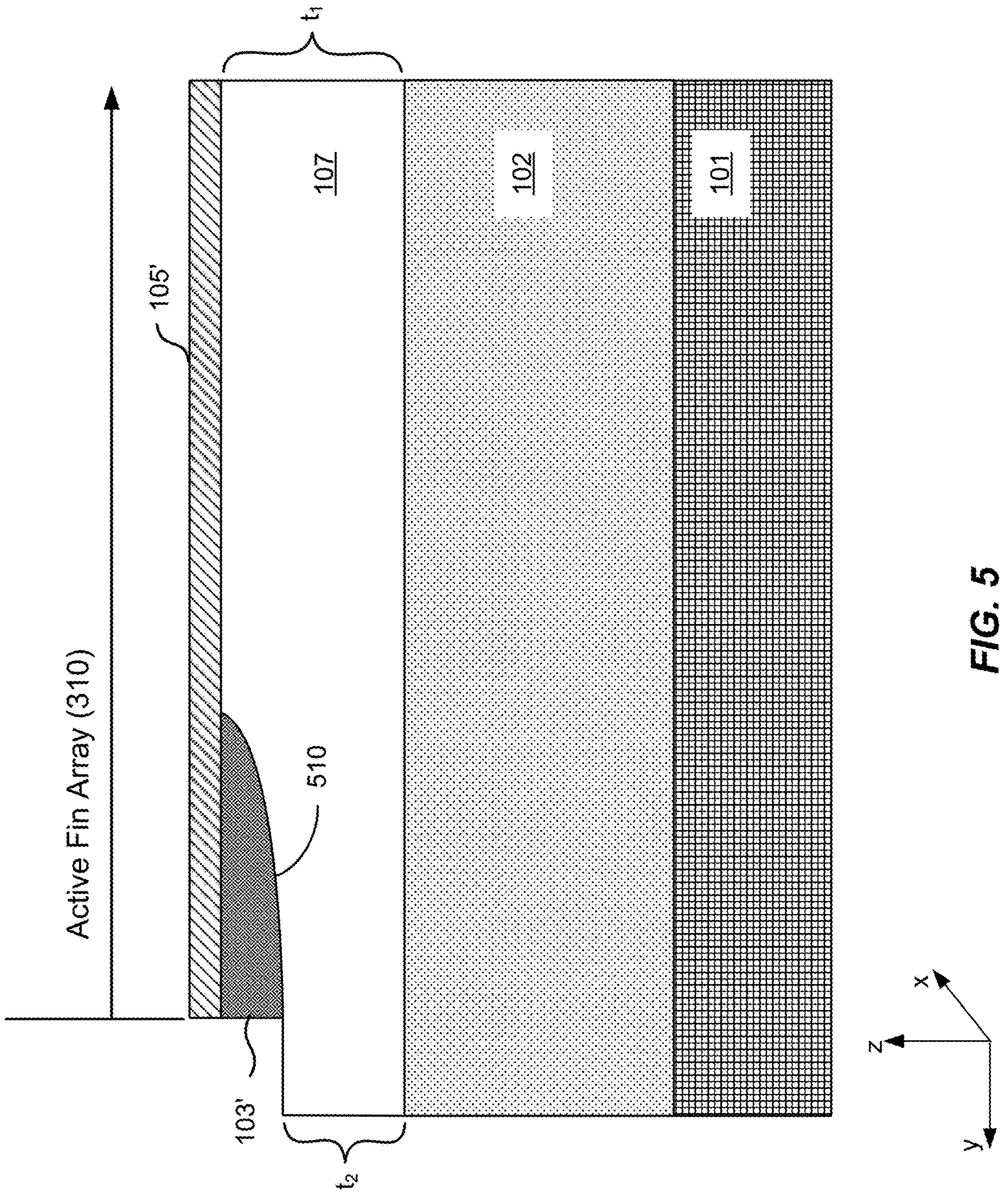
FIG. 5 is a cross-section drawing of the array of fins in the active area shown in FIG. 3A along a second direction according to an embodiment of the present invention.

FIG. 5 is a cross-section drawing of the array of fins in the active area shown in FIG. 3A along a second direction according to an embodiment of the present invention. The second direction is perpendicular to the first direction and passes from the fins into the gate region between the fins. In FIG. 5, the cross-section is taken along direction B-B' shown in FIG. 3A. As illustrated in the cross-section of the fin in the active fin array shown in FIG. 5, the structure is characterized by regrowth non-uniformity. FIG. 5 shares common elements with FIG. 4 and the description provided in relation to FIG. 4 is applicable to FIG. 5 as appropriate. Although multiple non-uniformities can be present in relation to the fin illustrated in FIG. 5, the discussion herein focuses on regrowth non-uniformity. In FIG. 5, the active fin array 310 is illustrated including source contacts 105' formed on the fins 103'.

Referring to FIG. 5, the thickness of the third semiconductor layer 107, also referred to as the regrown p-type GaN gate, varies as a function of lateral dimension (i.e., along the x-direction) due to edge effects at the edge of the fin array. The thickness decreases from thickness $t_1$ at portions of the fin adjacent the center of the fin array to thickness $t_2$ at the end of the fin. As a result, the fin sidewall is exposed above curve 510. In FIG. 5, the decrease in thickness is illustrated as curve 510, but it will be appreciated that FIG. 5 is merely a schematic diagram and the thickness variation can be present in other morphologies. In some embodiments, as illustrated in FIG. 5, the regrowth thickness decreases near the end of the fin, but in other embodiments, the regrowth thickness increases near the end of the fin, resulting in overgrowth to thicknesses higher than the fin thickness. Although they are not illustrated in FIG. 5, variation in gate trench depth, variation in doping concentration, and variation in fin width can also be present.

Thus, near the end of the fin, the gate growth may be irregular, exposing (or overfilling above) the fin. Similarly, p-GaN dopant incorporation may be irregular near the end of the fin, and the fin dimensions may vary in the same region.

Figure 6:
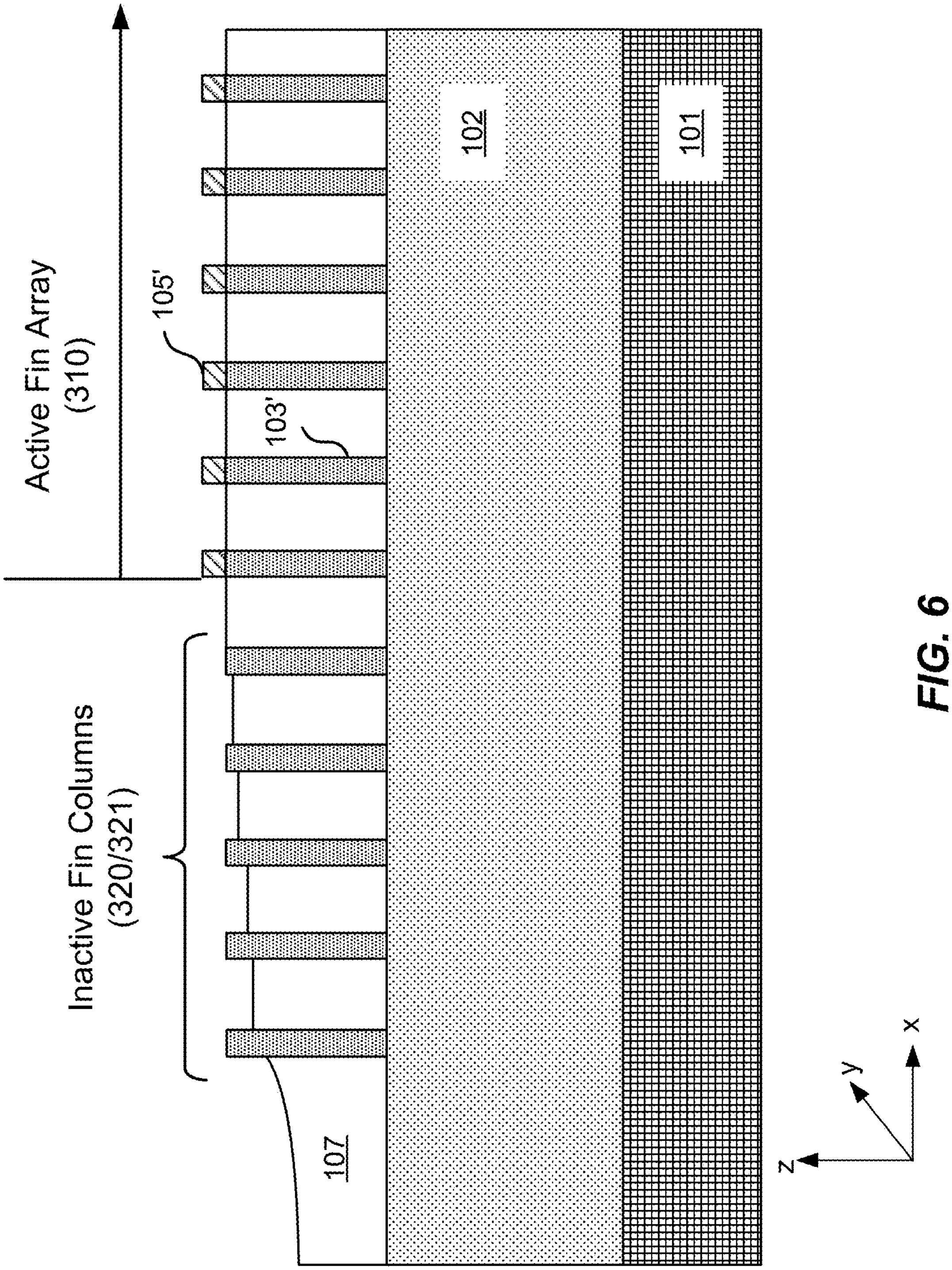
FIG. 6 is a cross-section drawing of the array of fins in the active area and inactive fins shown in FIG. 3B along the first direction according to an embodiment of the present invention.

FIG. 6 is a cross-section drawing of the array of fins in the active area and inactive fins shown in FIG. 3B along the first direction according to an embodiment of the present invention. Thus, FIG. 6 illustrates a cross-section of the array of fins in the active fin array as well as inactive fin columns. In FIG. 6, the cross-section is taken along direction A-A' shown in FIG. 3A. As discussed in relation to FIG. 5, near the end of the array of fins, in this example, in the area of the inactive fin columns 320, the thickness of the third semiconductor layer 107, also referred to as the regrown p-GaN gate, varies as a function of lateral dimension (i.e., along the x-direction) due to edge effects at the edge of the fin array. In addition to regrowth thickness non-uniformity, the other non-uniformities discussed above, including fin width variation and non-uniform dopant incorporation, may also be present. As illustrated in FIG. 6, the regrowth non-uniformity is present in the inactive fin columns 320, but not in the active fin array 310, which is characterized by uniform regrowth. Thus, in this embodiment, the regrowth non-uniformity, as well as the other non-uniformities discussed herein, is limited to the columns of inactive fins, which do not contribute to current flow though the FET device.

It should be noted that the source contacts 105' are only formed on fins in the active fin array 310 and not on the fins in the inactive fin columns 320 since the inactive fins do not contribute to current flow through the FET device. It should be noted that the source contacts 105' are shown in FIGS. 4 and 6 merely to illustrate the location of the fin surface, since the source contacts can be positioned behind the plane of the cross-section, in a manner similar to the positioning of the fins in some embodiments.

Figure 7:
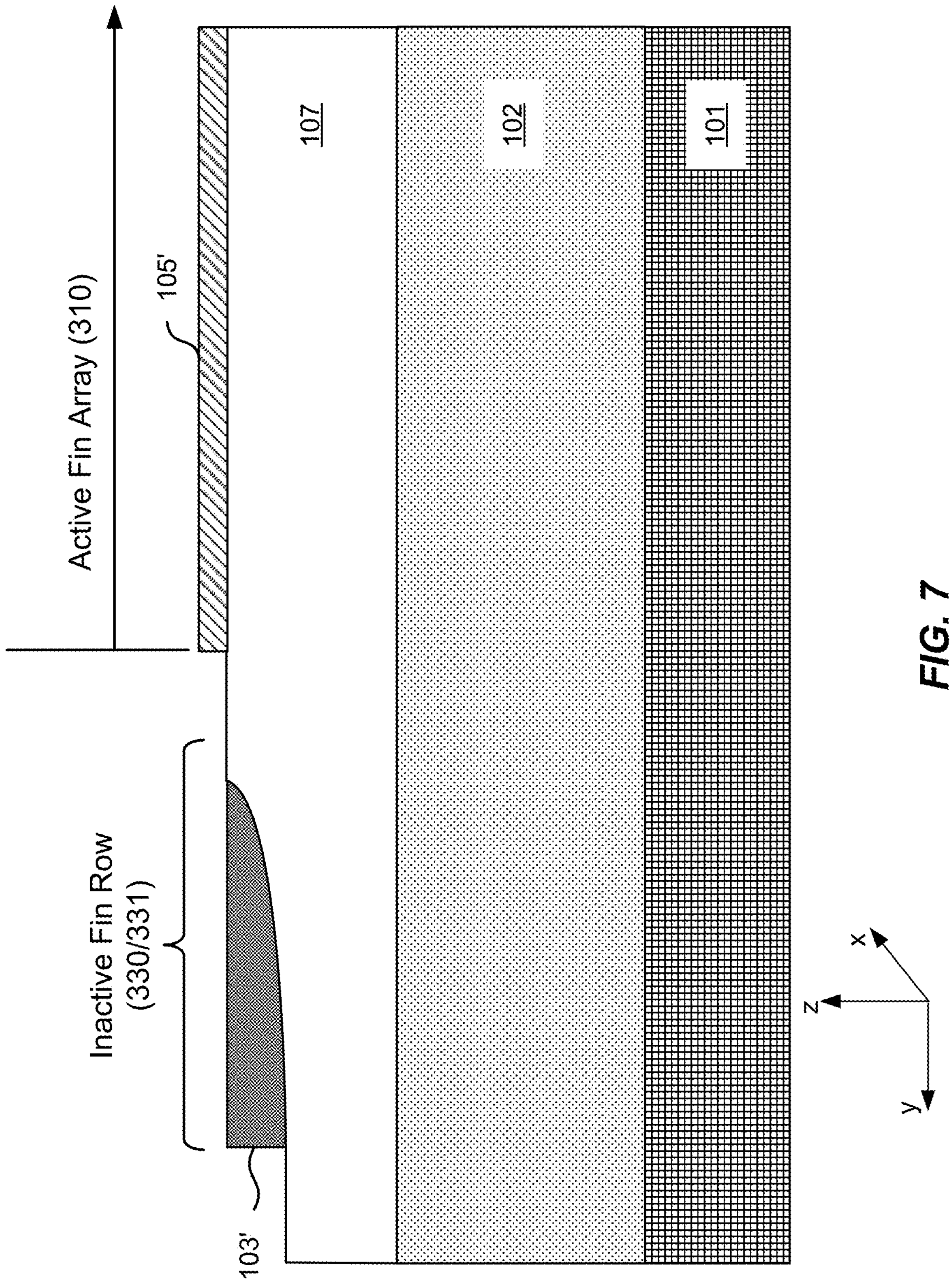
FIG. 7 is a cross-section drawing of a fin in an active fin array and an inactive fin row according to an embodiment of the present invention.

FIG. 7 is a cross-section drawing of a fin in an active fin array and an inactive fin row according to an embodiment of the present invention. In FIG. 7, the cross-section is taken along direction B-B' shown in FIG. 3A. FIG. 7 shares common elements with FIG. 6 and the description provided in relation to FIG. 6 is applicable to FIG. 7 as appropriate. Although multiple non-uniformities can be present in relation to the inactive fin illustrated in FIG. 7, the discussion herein focuses on regrowth non-uniformity.

Referring to FIG. 7, the thickness of the third semiconductor layer 107, also referred to as the regrown p-GaN gate, varies as a function of lateral dimension (i.e., along the y-direction) due to edge effects at the edge of the fin array. As discussed in relation to FIG. 6, near the end of the array of fins, in this example, in the area of the inactive fin row 330, the thickness of the third semiconductor layer 107, also referred to as the regrown p-GaN gate, varies as a function of lateral dimension (i.e., along the y-direction) due to edge effects at the edge of the fin array. In addition to regrowth thickness non-uniformity, the other non-uniformities discussed above, including fin width variation and non-uniform dopant incorporation, may also be present. As illustrated in FIG. 7, the regrowth non-uniformity is present in the inactive fin row 330, but not in the active fin array 310, which is characterized by uniform regrowth. Thus, in this embodiment, the regrowth non-uniformity, as well as the other non-uniformities discussed herein, is limited to the columns of inactive fins, which do not contribute to current flow through the FET device.

As shown in the cross-section illustrated in FIG. 7, the inactive fin row encompasses the region with irregular fill, doping, and/or fin dimension in order to prevent these non-uniformities from being present in the active array region.

Figure 8:
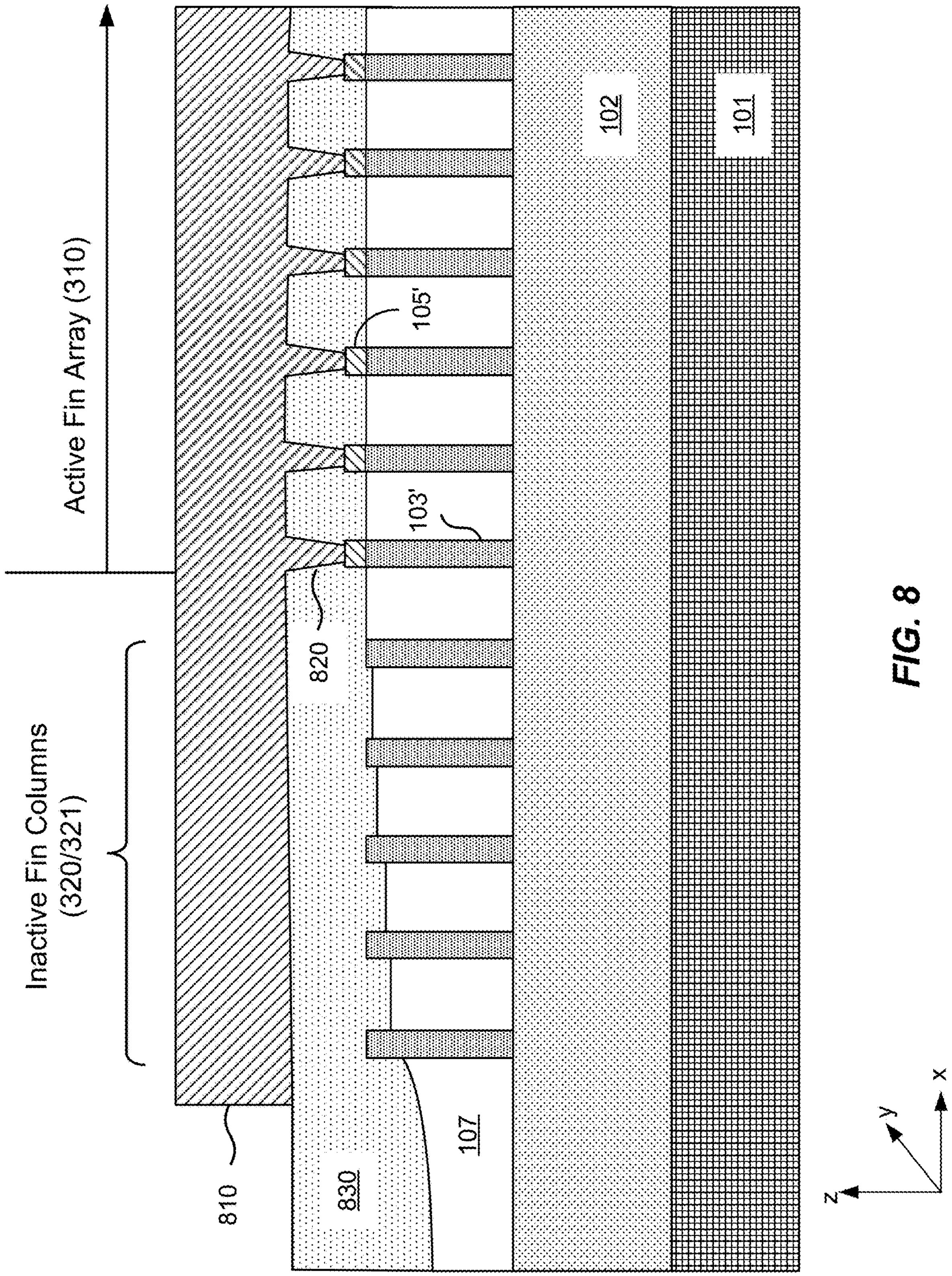
FIG. 8 is a cross-section drawing of the array of fins in the active area and inactive fins shown in FIG. 3B along the first direction according to an alternative embodiment of the present invention.

FIG. 8 is a cross-section drawing of the array of fins in the active area and inactive fins shown in FIG. 3B along the first direction according to an alternative embodiment of the present invention. In the cross-section of the array of fins in the active fin array and the inactive fin columns, a source pad metal is illustrated in FIG. 8. In FIG. 8, the cross-section is taken along direction A-A' shown in FIG. 3A. As illustrated in FIG. 8, electrical connection between the source pad metal 810 and source contacts 105' is provided through vias 820 passing through dielectric layer 830. No vias are present between the source pad metal 810 and the inactive fins in the inactive fin columns 320/321. In this embodiment, the source contact metal forming source contacts 105' is not present on the inactive fins in a manner similar to that shown in FIGS. 6 and 7. In other embodiments, the source contact metal is present on the inactive fins but the lack of vias and the presence of the dielectric layer 830 prevents the inactive fins from being electrically active. Although the inactive fins do not contribute to current flow in the FET device, they provide a region of predetermined dimensions between the active fin array and the area surrounding the active fin array, thereby resulting in uniform regrowth in the active fin array.

Embodiments of the present invention are applicable to arrays of vertical fin-based FETs in which the current runs vertically along the fin and the arrays of fins are enclosed by a gate-all-around structure so that all fins have a common gate. The gate-channel interface can be located on the vertical sidewall of the vertical fin. The FETs may be JFETs with regrown gates, implanted gates, or diffused gates, or they may be MOSFETs, including accumulation-mode MOSFETs. The vertical fin-based FETs can be fabricated using III-nitride semiconductors. In an embodiment, the vertical fin-based FETs are fabricated using GaN. In an embodiment, the number of inactive fin columns is between 1 and 10, and the number of inactive fin rows is between 1 and 5. In an embodiment, the inactive fin rows use fins of shorter height (see FIG. 3B) than the active fins in the active fin array. In an embodiment, the inactive fin row height is comparable to the width of the region encompassed by the inactive fin columns. Additional description related to implanted gates and diffused gates is provided in commonly assigned U.S. Patent Application Publication No. 2022/0254918, the disclosure of which is hereby incorporated by reference in its entirety for all purposes.

Figure 9:
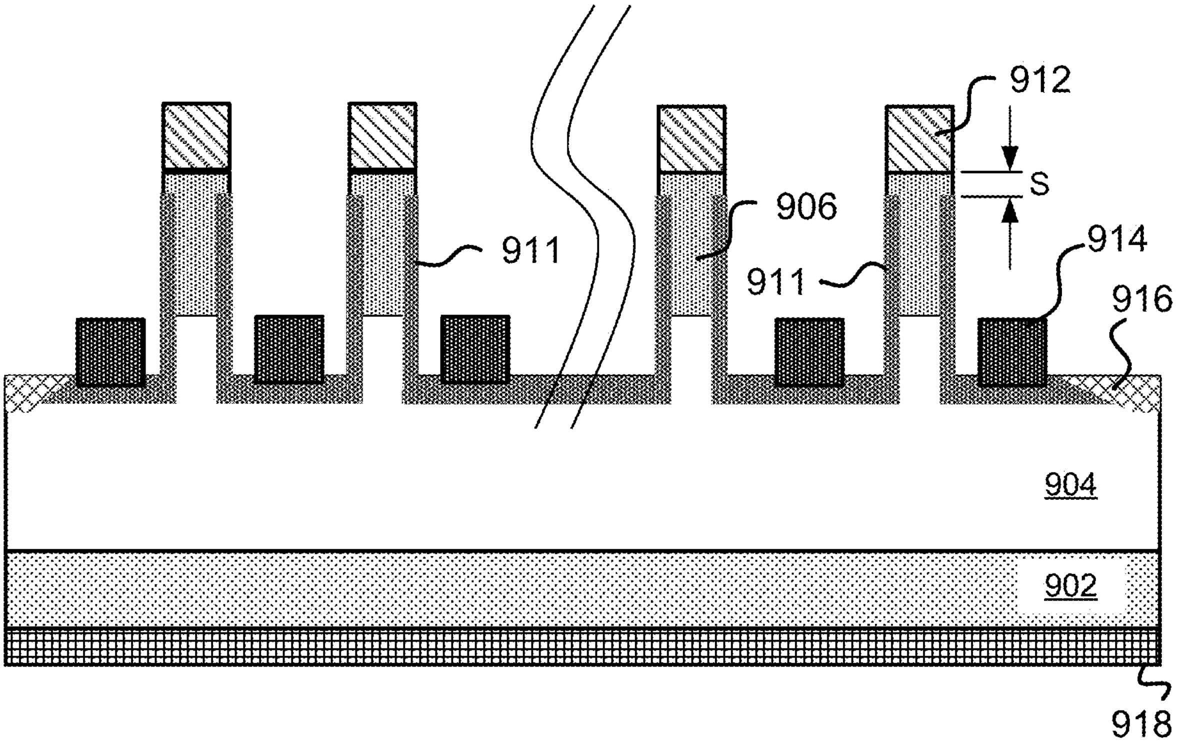
FIG. 9 is a simplified cross-sectional schematic diagram illustrating an example of an alternative fin-based, gate-all-around JFET structure with a diffused or implanted gate, which can be used in an array with inactive fins, according to an embodiment of the present invention.

FIG. 9 is a cross-section view of an alternative vertical, fin-based gate-all-around JFET device using implanted or diffused gates according to an embodiment of the present invention. In the alternative embodiment illustrated in FIG. 9, the regrown gate structure illustrated in FIG. 1D has been replaced with implanted or diffused gates. Although only a portion of the JFET device is illustrated in FIG. 9, it will be appreciated that the illustrated structure can be implemented as a portion of an active fin array in conjunction with one or more inactive fin columns and one or more inactive fin rows as described more fully herein. The use of the one or more inactive fin columns and one or more inactive fin rows enables the formation of uniform fins as described herein.

In FIG. 9, a source metal contact structure 912 is formed on an upper portion of a second III-nitride layer 906, which is coupled to a first III-nitride layer 904. Thus, source metal contact structure 912 is formed on the fins. Source metal contact structure 912 is electrically isolated from the semiconductor gate region 911. In FIG. 9, semiconductor gate region 911 extends along the sidewall of the fin and a physical separation S between semiconductor gate region 911 and source metal contact structure 912 can be utilized to provide electrical isolation. In some embodiments, the source metal contact structure 912 forms a self-aligned contact to the upper portion of second III-nitride layer 906. In some embodiments, the source metal contact structure 912 includes a hard mask metal layer. The source metal contact structure 912 may include titanium, aluminum, titanium nitride, combinations thereof, or the like.

Gate metal contact structure 914 is formed on the upper portion of semiconductor gate region 911. In some embodiments, the gate metal contact structure 914 can include a metallic structure. For example, the metallic structure may include nickel, palladium, silver, gold, combinations thereof, and the like. The metallic structure can make an ohmic contact with the semiconductor gate region 911, which can be a p-type semiconductor gate region. An edge termination 916 is formed on the p-type layer used as the semiconductor gate region 911 to enable high-voltage operation of the device. The p-type layer may also be connected to the source in some embodiments. A drain metal contact structure 918 is formed on a second side, i.e., the backside, of III-nitride substrate 902. The drain metal contact structure 918 can form an ohmic contact to the III-nitride substrate 902. In some embodiments, the drain metal contact structure 918 can include titanium, aluminum, or combinations thereof. In some embodiments, the drain metal contact structure 918 can further include a solderable metal structure such as silver, lead, tin, combinations thereof, or the like.

The semiconductor gate region 911 can be a diffused gate structure in which a diffusion source is utilized in a process in which diffusion dopants are incorporated into second III-nitride layer 906 and first III-nitride layer 904. As an example, a layer of a diffusion dopant material may be applied to the surfaces of the fins and first III-nitride layer 904. In some embodiments, the layer of diffusion dopant material may include either a metal layer formed with a p-type dopant (e.g., Mg, Zn, combinations thereof, and the like) or a metallic oxide layer formed with a p-type dopant (e.g., MgO, ZnO, combinations thereof, and the like), in contact with the exposed III-nitride surfaces of the fins. In some embodiments, the thickness of the metal or metallic oxide layer is 50-100 nm. In some embodiments, the layer of diffusion dopant material may further include a second layer of dielectric material (e.g., $SiO_2$, $Si_3N_4$ or the like) disposed on the metal or metallic oxide layer.

A thermal treatment can be used to diffuse the p-type dopant into the exposed surfaces of the first III-nitride layer 904 and the second III-nitride layer 906. The resulting channel can have a width of the fin width minus twice the diffusion depth. In some embodiments, the thermal treatment may be performed in a furnace at temperatures from 900° C. to 1100° C. In some embodiments, the thermal treatment may be performed in a rapid thermal annealer at temperatures from 1000° C. to 1450° C. In some embodiments, the thermal treatment may be performed at a high ambient pressure (e.g., at 1 GPa in a $N_2$ ambient), with or without the protective layer. In some embodiments, the heating may be a result of a series of rapid pulses (e.g., microwave). After diffusion, the diffusion dopant material may be removed, for example, by using a wet etch.

The alternate, vertical fin-based gate-all-around JFET structure using implanted or diffused gates illustrated in FIG. 9 may be used in place of the regrown-gate structure in an array of fins with inactive fins as described herein.

In other embodiments, rather than diffusion, ion implantation is utilized to form implanted gate regions. Accordingly, the discussion provided in relation to FIG. 9 with respect to diffusion doping can be applied in the context of ion implantation and annealing to form implanted gate regions. One of ordinary skill in the art would recognize many variations, modifications, and alternatives.

Figure 10:
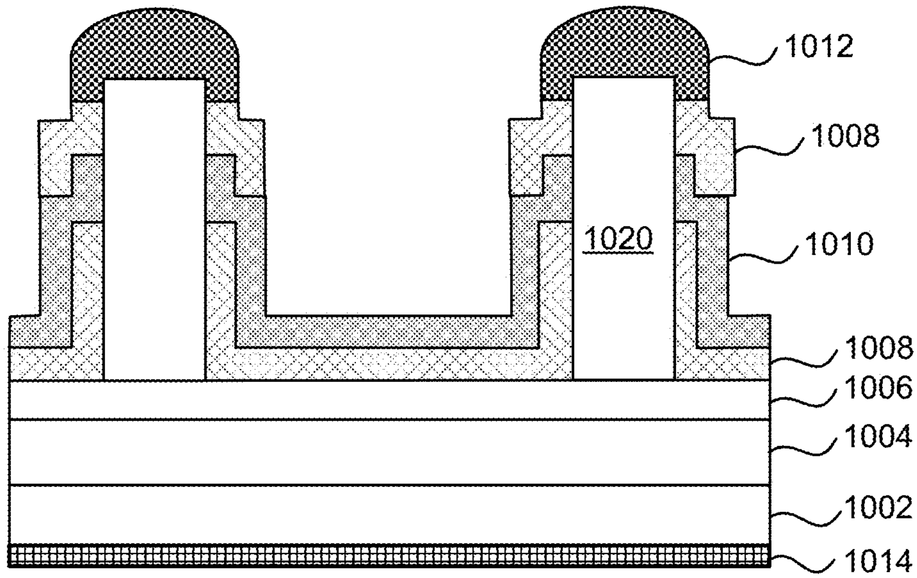
FIG. 10 is a simplified cross-sectional schematic diagram illustrating an example of an alternative fin-based, gate-all-around, accumulation-mode vertical metal-oxide-semiconductor FET (MOSFET) structure, which can be used in an array with inactive fins, according to an embodiment of the present invention.

FIG. 10 is a cross-section view of an alternative vertical, fin-based gate-all-around MOSFET device according to an embodiment of the present invention. The alternative embodiment illustrated in FIG. 10 can be used in an array with inactive fins and illustrates two active fins that can be implemented as a portion of an active fin array in conjunction with one or more inactive fin columns and one or more inactive fin rows as described more fully herein. The use of the one or more inactive fin columns and one or more inactive fin rows enables the formation of uniform fins as described herein. Referring to FIG. 10, substrate 1002, for example, an n-type GaN substrate, supports drift layer 1004 and graded layer 1006. Fins 1020 are formed in contact with graded layer 1006. Source contact 1012 is electrically connected to fin 1020 and a channel region is operated in conjunction with gate 1010, which is electrically isolated by dielectric 1008. During operation of this accumulation mode MOSFET, in response to gate bias, vertical current flow from source contact 1012 to drain contact 1014 passes through fins 1020.

Thus, in a manner similar to that discussed with respect to the JFET device discussed in relation to FIG. 9, the MOSFET device illustrated in FIG. 10 can be used in place of the regrown-gate structure and can use the inactive fin columns and one or more inactive fin rows to form uniform fins as described herein.

In addition to the above, the inventors have determined that, in order to achieve improved device performance, it is further desirable to fabricate additional structures that are electrically neutral (i.e., not conducting or having reduced conductivity), in order to reduce or minimize deleterious electrical effects, including extraneous junction leakage, floating semiconductor nodes, and the like. As shown in FIG. 8, there are no vias on the top of the fins in the inactive fin columns 320 (shown at the left side in FIG. 8). That is, those fins in the inactive fin columns are not electrically connected to the source, thus acting like floating nodes on the top of those fins. When there is a substantially positive voltage on the drain, which is at the bottom of the N+ doped substrate, the leakage current could cause those floating nodes to have a positive potential (in some cases, toward the drain potential) relative to the fins and the gate in the active fin array 310 (shown at the right side in FIG. 8). In some situations, the positive potential of those floating nodes may get to the point where an electrical breakdown of the PN junctions between the fins and the p-GaN gate in the extra fin columns occurs. The electrical breakdown may result in deleterious electrical effects.

Figure 11A:
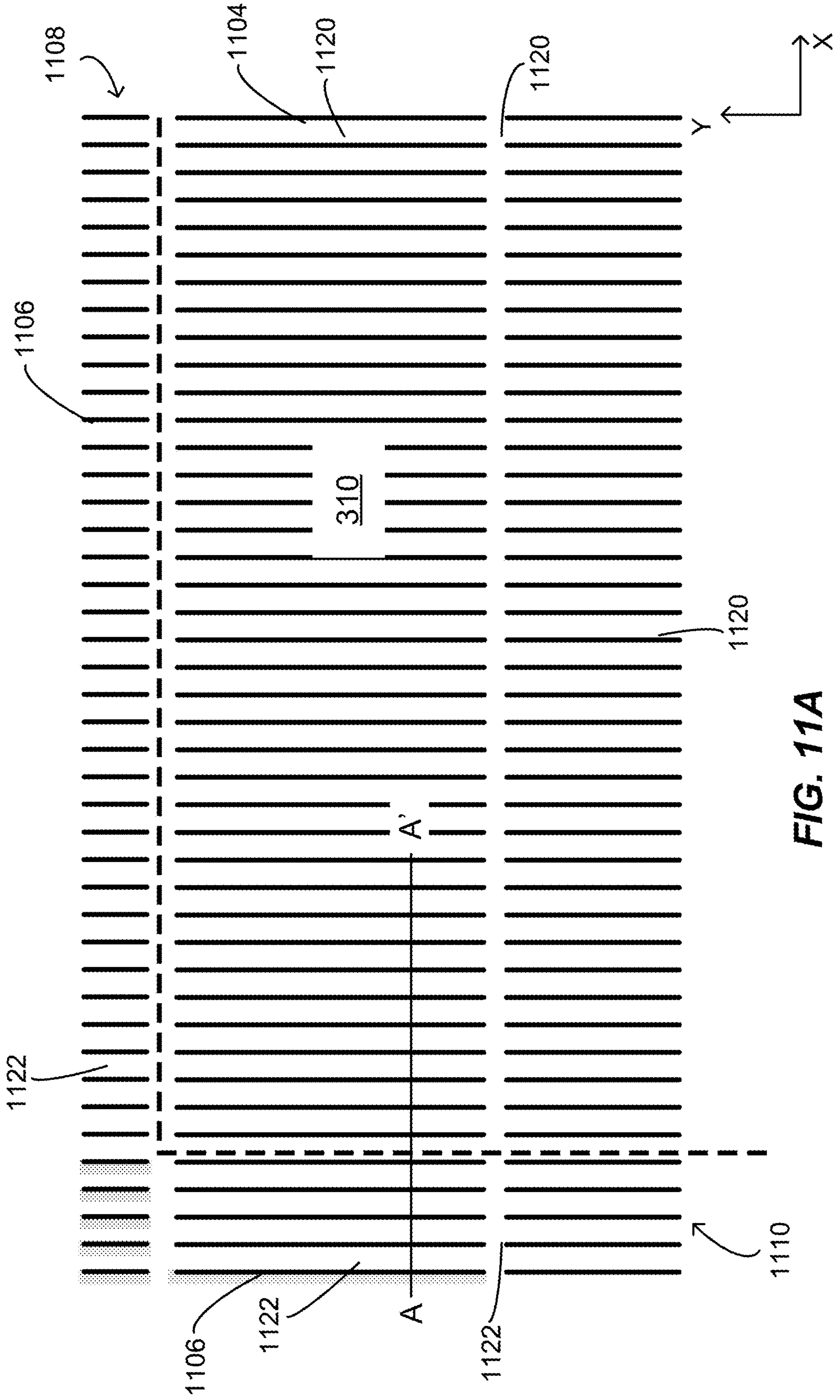
FIG. 11A illustrates a plan view layout of an array of fins with a neutralized fin row and multiple neutralized fin columns according to an embodiment of the present invention.

FIG. 11A illustrates a plan view layout of an array of fins with a neutralized fin row and multiple neutralized fin columns according to an embodiment of the present invention. The array of fins is fabricated using a neutralization implant mask opening around and including each neutralized fin. The neutralization implant mask openings are shown in as clear apertures surrounding the inactive fins 1106 in FIG. 11B. In FIG. 11A, only a single corner of the active fin array 310 (in the top-left corner) is illustrated for purposes of clarity, but it will be appreciated that the additional row(s) and additional column(s) of neutralized fins can be present on all four sides of the active array.

In the embodiment illustrated in FIG. 11A, the inactive fins 1106 in the neutralized fin row 1108, also referred to as an additional row of fins, have a length less than the active fins 1104 in the active fin array 310. Additionally, in the illustrated embodiments, the inactive fins 1106 in the neutralized fin columns 1110, also referred to as additional columns of fins, have a length that is equal to the active fins 1104 in the active fin array 310, but this is not required by the present invention and other embodiments can utilize differing lengths. The active fins 1104 in the active fin array 310 are surrounded by a gate region 1120. The inactive fins 1106 in the neutralized fin row 1108 and the neutralized fin columns 1110 are surrounded by an additional gate region 1122.

Figure 11B:
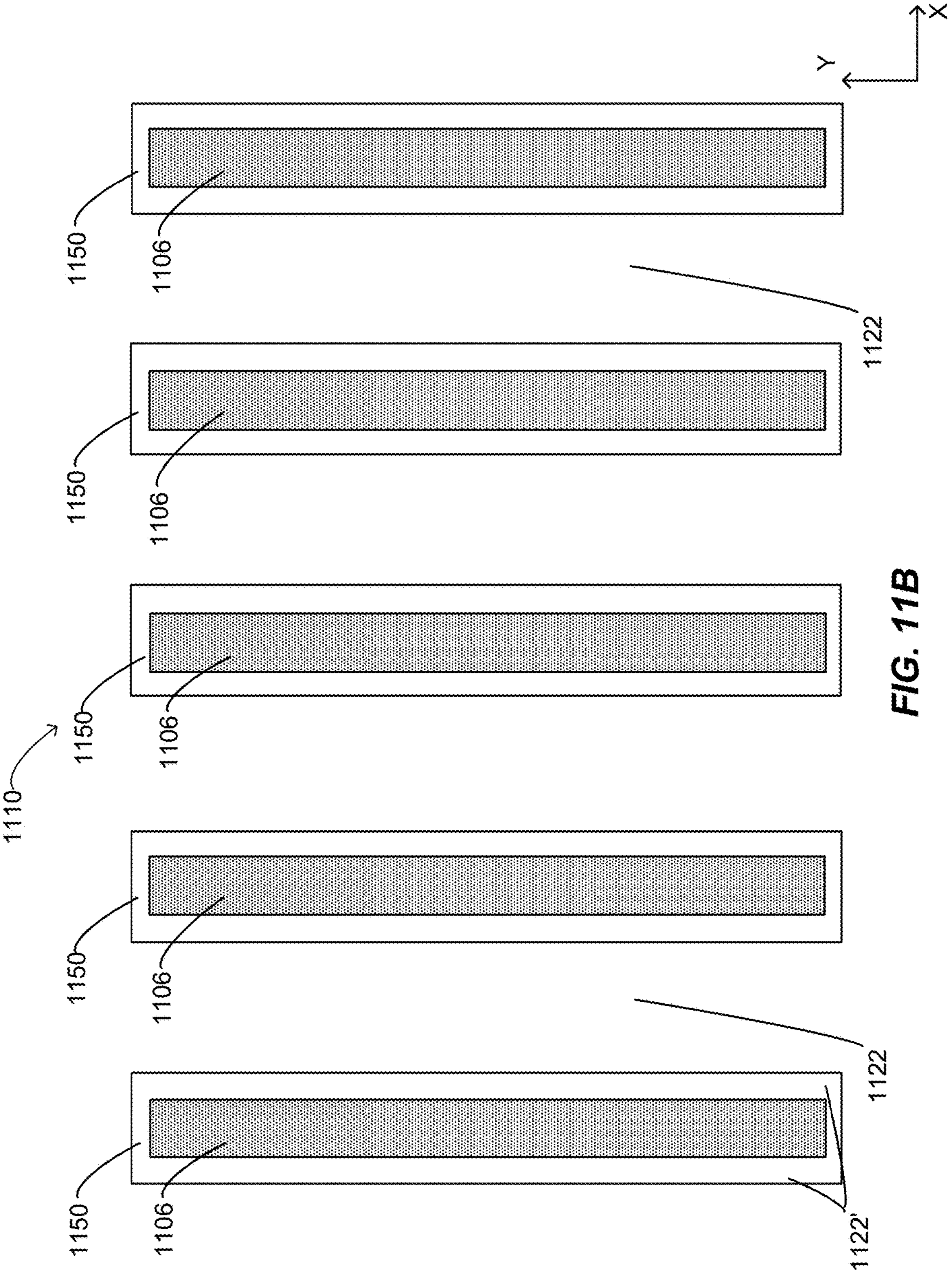
FIG. 11B illustrates a plan view layout of a set of inactive fins illustrated in FIG. 11A.

FIG. 11B is a plan view layout of a set of inactive fins illustrated in FIG. 11A. As illustrated in FIG. 11B, neutralization mask openings 1150 are formed surrounding each of the inactive fins 1106. The neutralization mask openings 1150 are utilized during a neutralization process in order to reduce the electrical conductivity of the areas exposed by the neutralization mask openings 1150. After the neutralization process, the inactive fins 1106 have a reduced electrical conductivity compared to the electrical conductivity of the active fins 1104, and the additional gate region 1122 has a portion 1122' that has a reduced electrical conductivity compared to the electrical conductivity of the gate region 1120. The portion 1122' is the fraction of the additional gate region 1122 that is exposed by the neutralization mask openings 1150. It should be appreciated that the neutralization mask openings 1150 can have a larger width (in the X-direction) than illustrated in FIG. 11B and a larger length (in the Y-direction) than illustrated in FIG. 11B. In one embodiment, the width of the neutralization mask openings 1150 is large enough such that the neutralization mask openings 1150 merge into a large neutralization mask opening that covers the entire area of the neutralized fin columns 1110 and the additional gate region 1122. That is, in this embodiment, the entire area of the additional gate region 1122 is exposed and neutralized.

Thus, the neutralization of the inactive fins 1106 and the portion 1122' of the gate region 1120 reduces the electrical conductivity at these regions, thereby reducing leakage. As discussed herein, neutralization does not require that the conductivity of the semiconductor material is equal to that of undoped material; rather, it includes reductions in conductivity compared to the conductivity of the material prior to a neutralization process. Thus, starting with a given doping level and initial conductivity in the third semiconductor layer making up the fins, the neutralization processes described herein can reduce the conductivity to a value lower than the value of the initial conductivity. As an example, neutralization as described herein includes a reduction in conductivity of at least 90%, at least 95%, at least 96%, at least 97%, at least 98%, at least 99%, at least 99.9%, at least 99.99%, at least 99.999%, at least 99.9999%, and the like. In other words, the sheet resistance value for the un-neutralized material (e.g., p-GaN material) can be on the order of 30 kΩ/□ and the sheet resistance value for the neutralized material can be on the order $10^7$ Ω/□, $10^8$ Ω/□, $10^9$ Ω/□, or more, achieving a modification in the resistivity/conductivity of four orders of magnitude or more.

Neutralizing the inactive fins 1106 and the portion 1122' of the gate region 1120 as described herein reduces the electrical conductivity of the inactive fins 1106 and the portion 1122' of the gate region 1120, thereby reducing their electrical activity or making them electrically inactive, resulting in many advantages. First, the junction leakage is significantly reduced. Second, the complexity of the masking step, the implant step, and the photoresist strip step are low. Third, implant energies are well controlled and can be easily modified to achieve any desired neutralization depth. Fourth, this implant can be combined with an existing implant step of the right implant energy, making the whole process flow very efficient.

In one embodiment, the neutralization process is an ion implantation process during which a neutralizing species is implanted into the areas exposed by the mask openings. The neutralizing species may be N, Ar, He, Si, or O, other suitable implant ions, or combinations thereof. In an embodiment, the dose of the neutralizing species is between $1\times10^{11}$ $cm^{-2}$ and $5\times10^{13}$ $cm^{-2}$. In an embodiment, the energy of the implantation is between 15 KeV and 700 KeV. In an embodiment, the energy of the implant for N is less than 500 KeV. In an embodiment, the energy of the implant for He is less than 200 KeV. In an embodiment, the energy of the implant for He is less than 170 KeV. In some embodiments, ion implantations with multiple energies are performed. In some embodiments, each of those ion implantations with multiple energies may have a different dose.

As an example, instead of nitrogen, other neutral species (e.g., argon, helium, or any combination of nitrogen, argon, and helium) can be used to perform ion implantation to neutralize the inactive fins 1106 and the portion 1122' of the gate region 1120. As another example, the implant depth can be controlled by changing implant energy. In one embodiment, the entire depth of the fins is fully implanted to neutralize the bottom of each fin. In another embodiment, shallow implantation is conducted, and the region close to the top surface of each fin is neutralized. In yet another embodiment, the implantation is intermediate between the full implant and shallow implantation.

The ion implantation processes used herein implant ionic species to increase the resistivity (i.e., decrease the conductivity) of predetermined portions of the semiconductor layer to provide a spatial variation or modulation in the conductivity. Without limiting embodiments of the present invention, the inventors believe that the implantation process reduces the conductivity by at least one of the following mechanisms: compensating for dopants, annihilating dopants, increasing vacancy density, increasing void density, decreasing the total net charge in the epitaxial layer, or decreasing the density of ionized acceptors (donors for n-type material). Some or all of these mechanisms may provide for increased resistivity. Throughout the specification, reference is made to decreased conductivity or increased resistivity, which can also be referred to as a decrease in active charge, a decrease in active dopant species, or the like. Due to the robust nature of GaN-based materials, ion implantation can produce implanted ions interspersed with unchanged epitaxial material, effectively reducing the conductivity in an averaged sense, with voids or vacancies interspersed in the lattice with as-grown epitaxial material. Embodiments of the present invention are not limited by the physical mechanism resulting in the spatial conductivity modulation. Additionally, the mechanisms associated with ion implantation are also applicable to diffusion processes and hydrogen plasma treatments are appropriate.

It should be understood that, although ion implantation is used as an example neutralization process, this is not intended to be limiting. In another embodiment, the neutralization process may further include a hydrogen plasma treatment process, which deactivates the dopant atoms in the p-GaN layer, or a plasma treatment process using other elements, e.g., N, O, Ar, or the like. Exposure of the p-GaN surface to a hydrogen plasma introduces H atoms into the p-GaN, where they can subsequently bond with Mg acceptors, forming Mg—H complexes, which neutralize the Mg as an acceptor.

Plasma treatments of the GaN surface with other species (e.g., N, O, Ar) can induce physical damage to the surface region to a depth dependent on the plasma energy. This damage can neutralize the conductivity of the GaN in a manner similar to that of implantation.

A plasma approach is not the only way that hydrogenation can be used to compensate holes in p-GaN. Thermal annealing in an $NH_3$-ambient at temperatures above 600° C. has been shown to increase p-GaN resistivity. This result is consistent with atomic hydrogen produced by $NH_3$ dissociation creating an Mg—H complex that neutralizes Mg as an acceptor. Such a process may be further included in the neutralization approach described herein.

Thus, some embodiments of the present invention form a non-conducting region in the exposed GaN surface by neutralizing the inactive fins 1106 present in the neutralized fin row 1108 and the neutralized fin columns 1110, for example, using ion implantation. Specifically, in these embodiments, an ion implantation process is performed to implant dopants into the third semiconductor layer 107. The implanted dopants pass through the opening in the implantation mask and stop in a region of the third semiconductor layer that includes the inactive fins and the area surrounding each of the inactive fins. In some embodiments, the implant dopants may include nitrogen, helium, or argon.

In some embodiments, the ion implantation process may introduce compensating donor levels in the third semiconductor layer to form the neutralized regions as a semi-insulating semiconductor region. In such embodiments, dopants may include oxygen and silicon. Such dopants may also introduce damage and traps into the third semiconductor layer.

In some embodiments, the ion implantation process may implant metallic ions into the third semiconductor layer. In such embodiments, the implant dopants may introduce deep levels in the third semiconductor layer to form the neutralized regions as a semi-insulating semiconductor region. Such dopants may include iron, titanium, and nickel.

In some embodiments, the ion implantation process may implant ions that physically damage the crystal lattice of the third semiconductor layer to create the neutralized regions as a non-conducting region. The damage may be extreme enough to create amorphous semiconductor material. A variety of ions can be used for this purpose, as long as the total dose is high enough to damage the semiconductor material.

Figure 12:
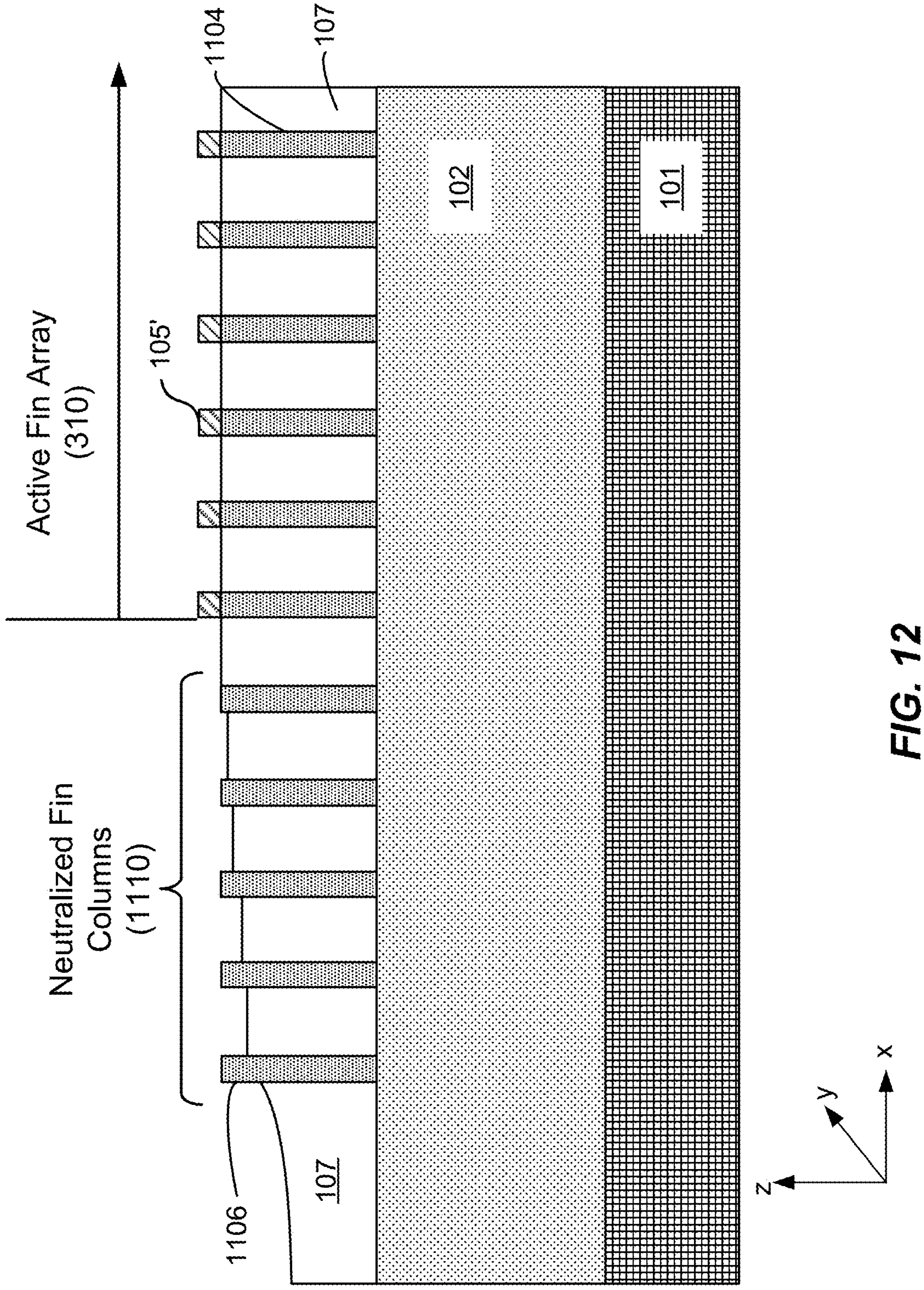
FIG. 12 is a cross-section drawing of a FinFET array along the first direction after gate formation according to an embodiment of the present invention.

FIG. 12 is a cross-section drawing of a FinFET array along the first direction after gate formation according to an embodiment of the present invention. FIG. 12 shares common elements with FIG. 6 and the description provided in relation to FIG. 6 is applicable to FIG. 12 as appropriate. In this cross-section drawing, which illustrates the direction aligned with cross-section A-A' in FIG. 11A, third semiconductor layer 107 has been formed, for example, by a regrowth process, between the active fins 1104 in the active fin array 310 and between the inactive fins 1106 in the neutralized fin columns 1110. Thus, in FIG. 12, the inactive fins in the inactive fin columns 320 illustrated in FIG. 6 will not only be inactive due to lack of electrical contacts, but will also have reduced electrical conductivity due to the use of the neutralization process discussed herein. Thus, the description as neutralized fin columns 1110. The variable height of the surface of third semiconductor layer 107 is only exemplary, and may be more or less uniform than shown in FIG. 12.

Figure 13:
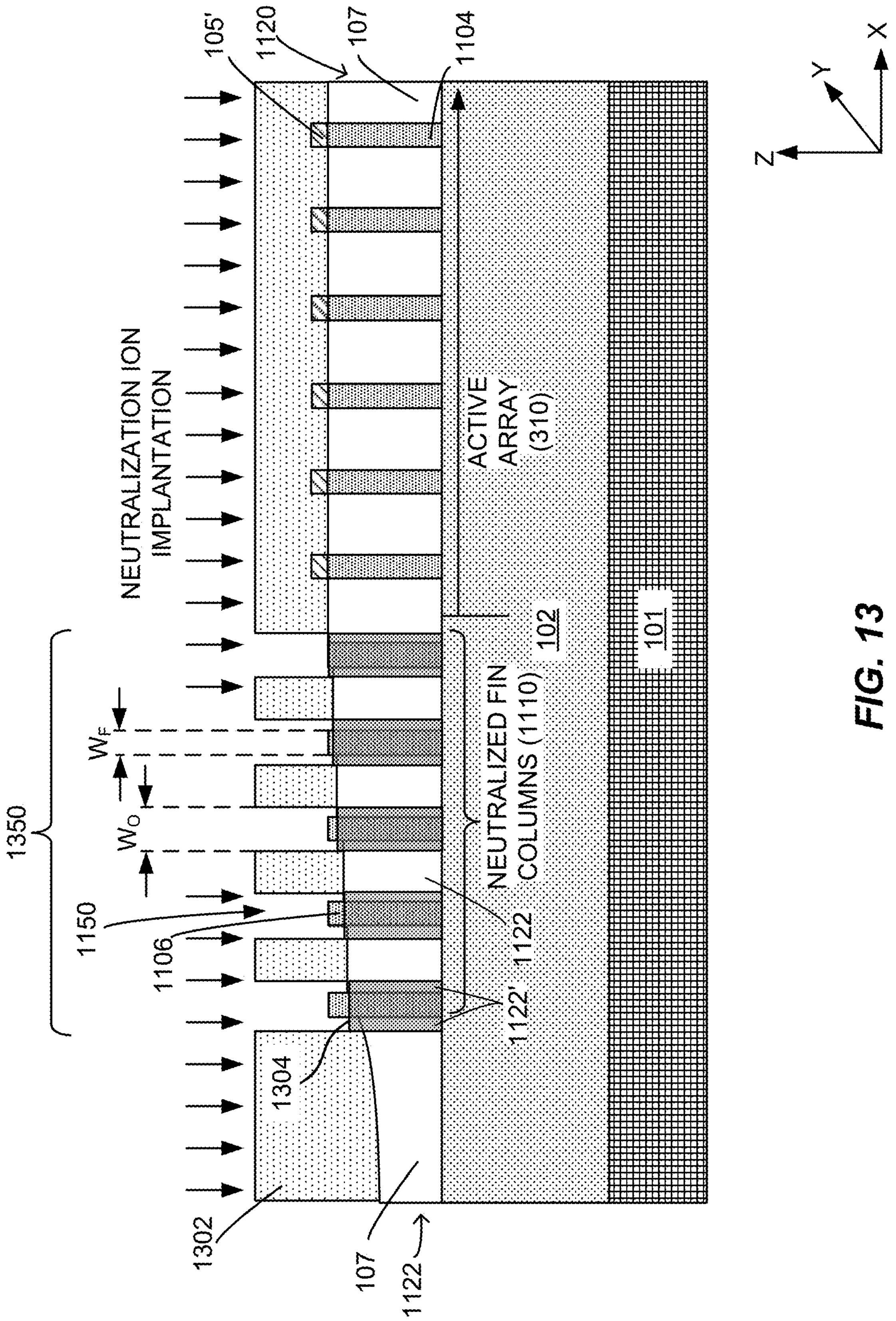
FIG. 13 is a cross-section drawing of a FinFET array along the first direction during a neutralization ion implantation process according to an embodiment of the present invention.

FIG. 13 is a cross-section drawing of a FinFET array along the first direction during a neutralization ion implantation process according to an embodiment of the present invention. In this cross-section drawing, which illustrates the direction aligned with cross-section A-A' in FIG. 11A, the neutralization mask 1302 is illustrated as covering the active fin array 310. The neutralization mask 1302 has neutralization mask openings 1150 through which ions are implanted into inactive fins 1106 as well as the portion 1122' of the additional gate region 1122 adjacent to each inactive fin 1106. It should be understood that the implanted regions 1304 shown in FIG. 13 are exemplary, and the implantation depth does not necessarily have to reach the interface between the first semiconductor layer 102 (i.e., the n-type drift region) and the third semiconductor layer 107 (i.e., the p-type regrown gate material). Thus, in some embodiments, the implantation depth (in the Z-direction as shown in FIG. 13) is between 60% and 80% of the height of the inactive fins 1106 in the Z-direction. In other words, only a portion of each inactive fin 1106 is neutralized. In some embodiments, the implantation depth may exceed the height of the inactive fins 1106 in the Z-direction, thereby extending into the first semiconductor layer 102.

Referring to FIG. 13, the neutralization mask 1302, which can be formed using photoresist or other suitable mask materials, is formed on third semiconductor layer 107 in both the gate region 1120 and the additional gate region 1122. The neutralization mask 1302 includes neutralization mask openings 1150 that expose the inactive fins 1106 as well as a portion 1122' of the additional gate region 1122 surrounding each inactive fin 1106. The neutralization mask 1302 masks or covers the active fin array 310 (i.e., the array of active fins 1104). In the illustrated embodiment, the width $W_O$ of neutralization mask openings 1150 is approximately twice the width $W_F$ of the inactive fins 1106, but this is not required by the present invention. In other embodiments, the width $W_O$ is substantially equal to the width $W_F$.

In yet other embodiments, the width $W_O$ is substantially equal to the pitch between inactive fins, resulting in implantation of substantially all the material in the third semiconductor layer 107 surrounding the inactive fins 1106. In these embodiments, the neutralization mask 1302 is open in area 1350, thereby resulting in neutralization of all of area 1350. In an alternative embodiment, the neutralization mask 1302 exposes a portion of, rather than all of, the inactive fins 1106 and the additional gate region 1122 surrounding each of the exposed inactive fins 1106. Therefore, only a portion of the inactive fins 1106 and the additional gate region 1122 are neutralized. One of ordinary skill in the art would recognize many variations, modifications, and alternatives.

In the example illustrated in FIG. 13, ion implantation is utilized to implant the exposed surface not masked by neutralization mask 1302 with neutralizing ionized elements (e.g., N, Ar, He, Si, or O), other suitable implant ions, or combinations thereof, to neutralize the conductivity of the exposed inactive fins 1106 as well as the conductivity of the exposed third semiconductor layer 107 (e.g., regrown GaN gate regions) surrounding the inactive fins 1106. The dose of the implant may be between $1\times10^{11}$ cm$^{-2}$ and $5\times10^{13}$ cm$^{-2}$. The energy of the implant may be between 15 keV and 700 keV. In an embodiment, the energy of the implant for N is less than 500 KeV. In an embodiment, the energy of the implant for He is less than 200 KeV. In an embodiment, the energy of the implant for He is less than 170 KeV. In some embodiments, multiple energy implantations and/or multiple doses are performed. In some embodiments, each of the multiple energy implantations has a different dose. After ion implantation, the inactive fins 1106 may be referred to as neutralized fins. Additionally, the exposed third semiconductor layer 107 can be referred to as neutralized gate material.

As a result of the ion implantation, the inactive fins 1106 are characterized by a reduced electrical conductivity compared to an electrical conductivity of the active fins 1104 in the active fin array 310. Accordingly, the inactive fins 1106 contribute significantly less to junction leakage in the transistor array. In one embodiment, the reduced electrical conductivity is reduced by at least 90%. In another embodiment, the reduced electrical conductivity is reduced by at least 99%. In yet another embodiment, the inactive fins 1106 are electrically neutral, and so do not contribute to junction leakage in the transistor array. As an example, since the top of each inactive fin 1106 can act like a floating node, reducing the conductivity of these inactive fins 1106 can reduce charging of the inactive fin 1106 and improve device performance by preventing breakdown.

Likewise, the neutralized gate material in the additional gate region 1122 surrounding the inactive fins 1106 is characterized by a second reduced electrical conductivity compared to an electrical conductivity of the gate region 1120 surrounding the active fins 1104 in the active fin array 310, i.e., the primary array of fins. Accordingly, the neutralized gate material in the additional gate region 1122 contributes significantly less to junction leakage in the transistor array. In one embodiment, the second reduced electrical conductivity is reduced by at least 90%. In another embodiment, the second reduced electrical conductivity is reduced by at least 99%. In yet another embodiment, the neutralized gate material surrounding the inactive fins 1106 is electrically neutral, and so do not contribute to junction leakage in the transistor array.

As illustrated in FIG. 13, source contacts 105' are formed at the top of the active fins 1104 after neutralizing the inactive fins 1106 and the portion 1122' of the additional gate region 1122 surrounding the inactive fins 1106. In an embodiment shown in FIG. 13, no source metal contact is formed on the inactive fins 1106. In another embodiment, the source contacts 105' are formed on the inactive fins 1106.

Figure 14:
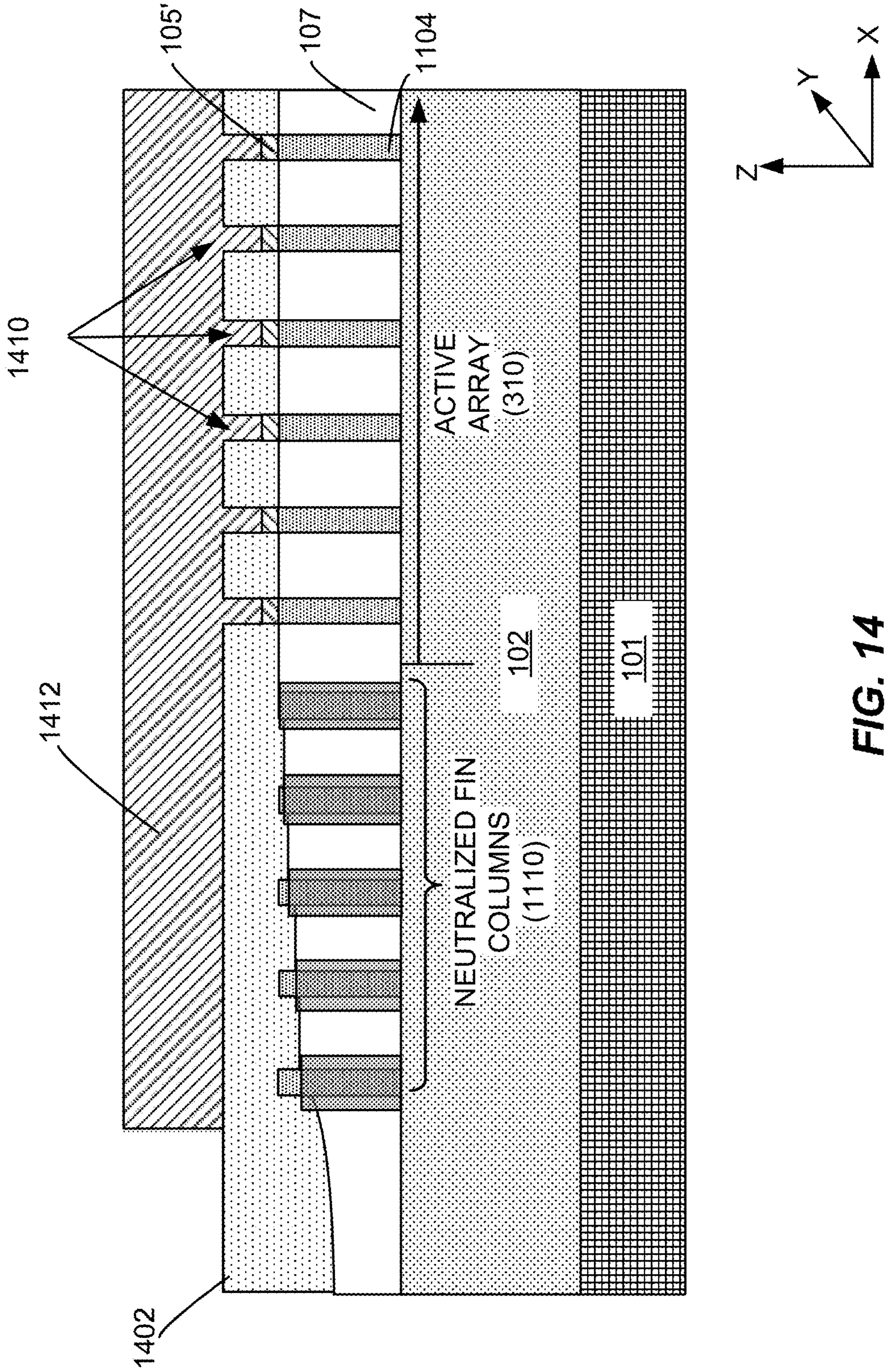
FIG. 14 is a cross-section drawing of a FinFET array along the first direction after a metallization process according to an embodiment of the present invention.

FIG. 14 is a cross-section drawing of a FinFET array along the first direction after a metallization process according to an embodiment of the present invention. In this cross-section drawing, which illustrates the direction aligned with cross-section A-A' in FIG. 11A, the neutralization mask 1302 illustrated in FIG. 13 has been removed and interlayer dielectric 1402 has been deposited. In order to make electrical connections to the active fins 1104 in the active fin array 310, vias 1410 have been formed in interlayer dielectric 1402 on top of the source contacts 105', which have been deposited on the top surface of the active fins 1104 in the active fin array 310.

Referring to FIG. 14, a source pad metal 1412 extends through vias 1410 to make contact and electrical connection with source contacts 105'. In an embodiment, the source pad metal 1412 can be patterned so that one region (i.e., the source pad) connects all of the source contacts 105', and one region (i.e., the gate pad) connects to the gate metal contact (not shown).

Figure 15:
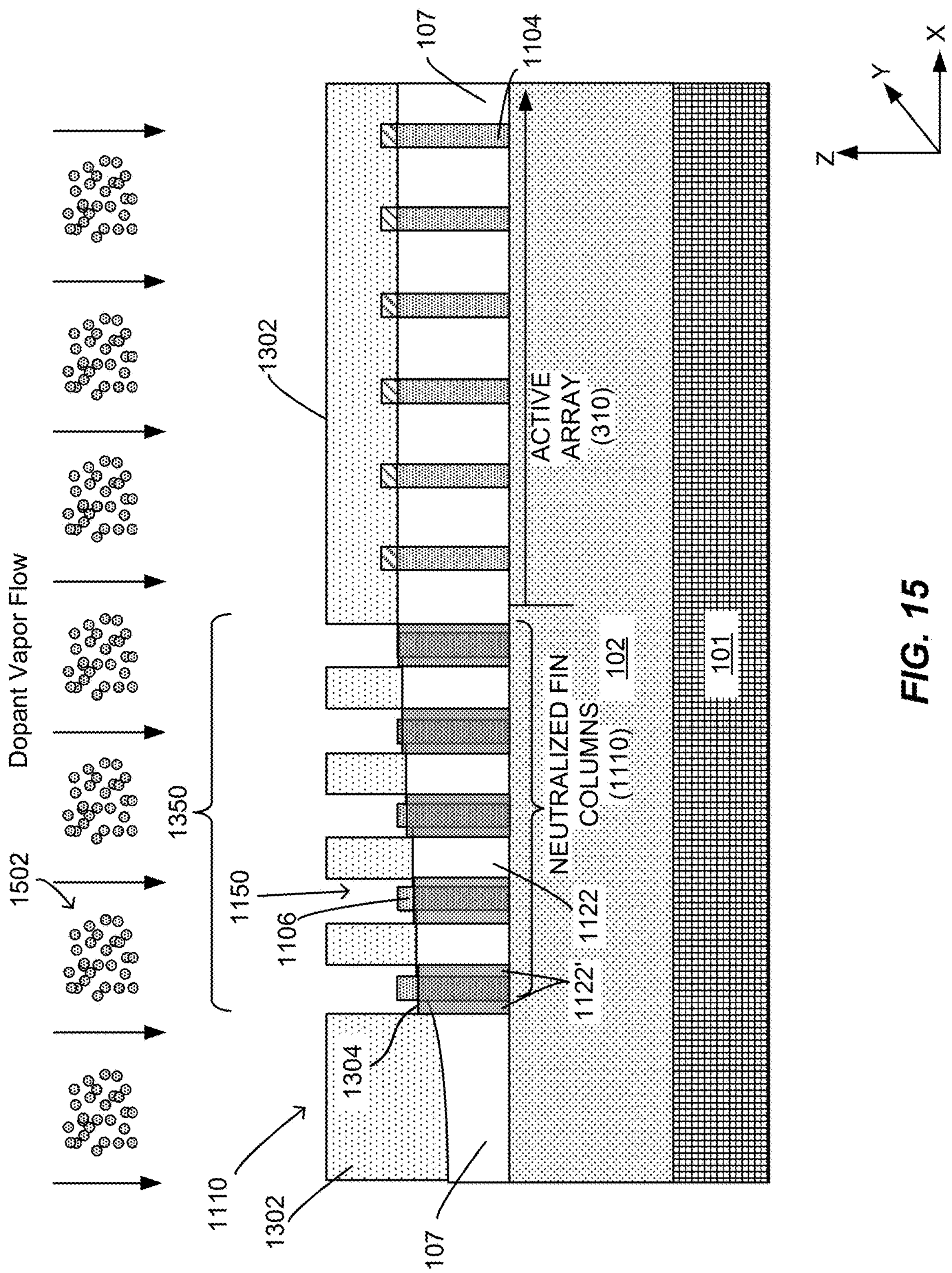
FIG. 15 is a cross-section drawing of a FinFET array along the first direction during a neutralization diffusion process according to an embodiment of the present invention.

FIG. 15 is a cross-section drawing of a FinFET array along the first direction during a neutralization diffusion process according to an embodiment of the present invention. In this cross-section drawing, which illustrates the direction aligned with cross-section A-A' in FIG. 11A, the neutralization mask 1302 is illustrated as covering the active fin array 310. The neutralization mask 1302 has neutralization mask openings 1150 through which dopant is diffused into the inactive fins 1106 as well as the portion 1122' of the additional gate region 1122 adjacent to each inactive fin 1106. In the example shown in FIG. 15, the wafer, which is typically placed in a diffusion furnace, is exposed to a high-temperature environment of dopant vapor 1502. The dopant vapor 1502 reaches the inactive fins 1106 and the portion of third semiconductor layer 107 that is exposed by the neutralization mask openings 1150. Although the dopant vapor flow is in the Z-direction in the illustrated example, this is not intended to be limiting. In other embodiments, the dopant vapor flow is in the X-direction. In addition, although a gaseous diffusion is illustrated in FIG. 15, nongaseous diffusion can be employed in other embodiments. In a nongaseous diffusion process, also referred to as a solid phase diffusion process, dopant ions are pre-deposited on the surface and then thermally diffused into the underlying layer(s) by high-temperature processing. Neutralization mask 1302 may include a dielectric material such as silicon dioxide, silicon nitride, silicon oxynitride, aluminum oxide, combinations thereof, or the like.

As mentioned above, various neutralization techniques can be employed to neutralize the inactive fins 1106 as well as the portion 1122' of the additional gate region 1122 adjacent to each inactive fin 1106. In addition to ion implantation, hydrogen plasma treatment, plasma treatment using elements other than hydrogen, and/or diffusion processes can be utilized.

Figure 16:
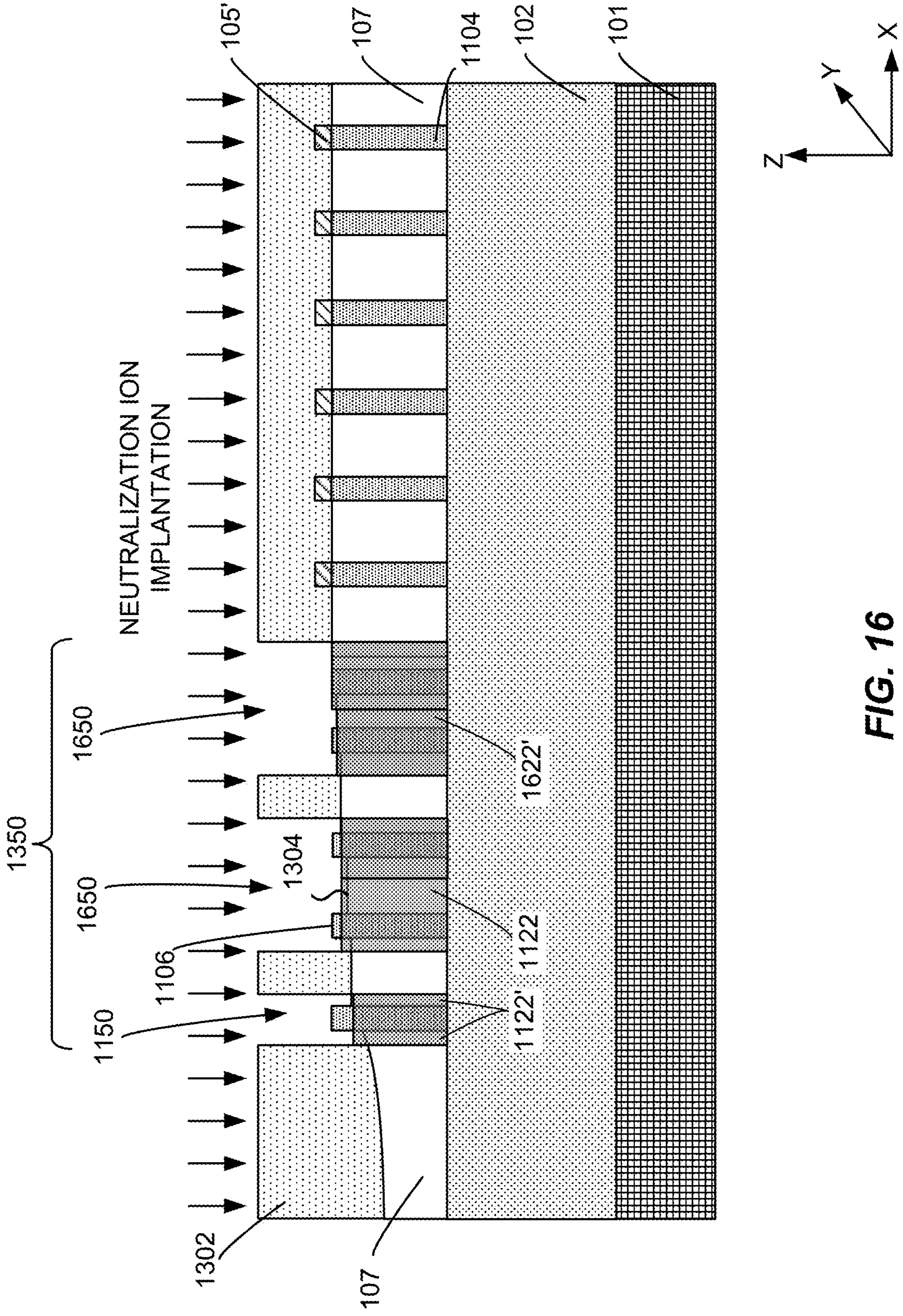
FIG. 16 is a cross-section drawing of a FinFET array along the first direction during a neutralization ion implantation process according to an embodiment of the present invention.

FIG. 16 is a cross-section drawing of a FinFET array along the first direction during a neutralization ion implantation process according to an embodiment of the present invention. In this cross-section drawing, which illustrates the direction aligned with cross-section A-A' in FIG. 11A, the neutralization mask 1302 is illustrated as covering the active fin array 310. The neutralization mask 1302 has neutralization mask openings 1150 through which ions are implanted into inactive fins 1106 as well as the portion 1122' of the additional gate region 1122 adjacent to each inactive fin 1106. Different from the example shown in FIG. 13, neutralization mask openings 1650 correspond to two inactive fins 1106. As a result, a larger portion 1622' of the additional gate region 1122 are neutralized as compared to that in the example shown in FIG. 13. One of ordinary skill in the art would recognize many variations, modifications, and alternatives.

FIG. 17 is a simplified flowchart illustrating a method of forming a transistor array, according to an embodiment of the present invention. The method 1700 includes forming an array of FinFETs comprising a plurality of rows and columns of active fins with source contacts (1702). Each of the active fins is surrounded by an active gate region. As illustrated in FIG. 11A, the active fins 1104 are arranged in a plurality of rows and columns. As illustrated in FIG. 13, the active fins 1104 in the active fin array 310 are formed, and source contacts 105' are formed on the top surface of the active fins 1104.

The method also includes forming one or more rows of first inactive fins disposed on a first set of sides of the array of FinFETs (1704). Each of the first inactive fins is surrounded by an additional gate region. As illustrated in FIG. 11A, neutralized fin row 1108, which can be one of one or more rows of inactive fins, is disposed on a first set of sides (i.e., top and bottom in this example) of the active fin array 310, and each of the first inactive fins 1106 is surrounded by the additional gate region 1122.

The method also includes forming one or more columns of second inactive fins disposed on a second set of sides of the array of FinFETs (1706). Each of the second inactive fins is surrounded by the additional gate region. As illustrated in FIG. 11A, the neutralized fin columns 1110, which are illustrated as a plurality of columns, but can be one or more columns of inactive fins, are disposed on a second set of sides (i.e., left and right in this example) of the active fin array 310, and each of the second inactive fins 1106 is surrounded by the additional gate region 1122.

The method also includes forming a neutralization mask having openings exposing the first inactive fins, the second inactive fins, and a portion of the additional gate region (1708). In an embodiment, a portion of the additional gate region is the entire area of the additional gate region. As illustrated in FIG. 13, the neutralization mask 1302, which can be formed using photoresist or other suitable mask materials, is formed on third semiconductor layer 107 in both the gate region 1120 and the additional gate region 1122. The neutralization mask 1302 includes neutralization mask openings 1150 that expose the inactive fins 1106 as well as a portion 1122' of the additional gate region 1122 surrounding each inactive fin 1106. The neutralization mask 1302 masks or covers the active fin array 310 (i.e., the array of active fins 1104). In an embodiment, the width $W_O$ of the neutralization mask openings 1150 is substantially equal to the pitch between inactive fins, resulting in implantation of substantially all of the third semiconductor layer 107 surrounding the inactive fins 1106. In these embodiments, the neutralization mask 1302 is open in area 1350, thereby resulting of neutralization in all of area 1350. In the alternative embodiment shown in FIG. 16, some of the neutralization mask openings 1150 may correspond to two inactive fins 1106. As a result, as illustrated in FIG. 16, a larger portion 1622' of the additional gate region 1122 is neutralized as compared to that in the example shown in FIG. 13. In a specific embodiment, the neutralization mask 1302 exposes a portion of, rather than all of, the inactive fins 1106 and the additional gate region 1122 surrounding each of the exposed inactive fins 1106. Therefore, only a portion of the inactive fins 1106 and the additional gate region 1122 are neutralized. One of ordinary skill in the art would recognize many variations, modifications, and alternatives.

The method also includes reducing an electrical conductivity of the first inactive fins, the second inactive fins, and the portion of the additional gate region (1710). As illustrated in FIG. 13, neutralization mask openings 1150 are formed surrounding each of the inactive fins 1106. The neutralization mask openings 1150 are utilized during a neutralization process in order to reduce the electrical conductivity of the areas exposed by those neutralization mask openings 1150. After the neutralization process, the inactive fins 1106 have a reduced electrical conductivity compared to the electrical conductivity of the active fins 1104, and the additional gate region 1122 has a portion 1122' that has a reduced electrical conductivity compared to the electrical conductivity of the gate region 1120. The portion 1122' is the additional gate region 1122 that is exposed by the neutralization mask openings 1150. In an embodiment, reducing the electrical conductivity comprises reducing the electrical conductivity by at least 90%. In another embodiment, reducing the electrical conductivity comprises reducing the electrical conductivity by at least 99%.

In the embodiment shown in FIG. 13, reducing the electrical conductivity comprises ion implanting a dopant into the inactive fins 1106 and the portion 1122' of the additional gate region 1122. As illustrated in FIG. 13, a neutralizing species is implanted into the areas exposed by the neutralization mask openings 1150. The neutralizing species may be N, Ar, He, Si, or O, other suitable implanted ionized elements, or combinations thereof. In an embodiment, the dose of the neutralizing species is between $1\times10^{11}$ $cm^{-2}$ and $5\times10^{13}$ $cm^{-2}$. In an embodiment, the energy of the implantation is between 15 KeV and 700 KeV. In some embodiments, ion implantations with multiple energies are performed. In some embodiments, each of those ion implantations with multiple energies may have a different dose.

In the embodiment shown in FIG. 15, reducing the electrical conductivity comprises performing a diffusion process on the inactive fins 1106 and the portion 1122' of the additional gate region 1122. As illustrated in FIG. 15, the wafer, which is typically placed in a diffusion furnace, is exposed to a high-temperature environment of dopant vapor 1502. The dopant vapor 1502 reaches the inactive fins 1106 and the portion of the third semiconductor layer 107 that is exposed by the neutralization mask openings 1150.

In yet another embodiment, reducing the electrical conductivity comprises performing a hydrogen plasma treatment process on the inactive fins and the portion of the additional gate region.

The methods provided according to embodiments of the present invention can also include removing the neutralization mask. In an embodiment, the neutralization mask is removed using an oxygen plasma. In another embodiment, the neutralization mask is removed using a wet cleaning process. In yet another embodiment, the neutralization mask is removed using a combination of an oxygen plasma and a wet cleaning process.

The methods provided according to embodiments of the present invention can also include forming a junction terminated extension (JTE) region, for example, as described in U.S. Patent Application Publication Nos. 2022/0013626, and 2022/0238643, the disclosures of which are hereby incorporated by reference in their entirety for all purposes. In some embodiments, the neutralization implantation may be performed simultaneously with the formation of the JTE region.

The methods provided according to embodiments of the present invention can also include forming a gate metal contact to the gate region and after forming the gate metal contact, depositing an interlayer dielectric. The work function of the gate metal is such that the gate metal electrode depletes the fin at zero bias as described in U.S. Patent Application Publication No. 2021/0407815, the disclosure of which is hereby incorporated by reference in its entirety for all purposes. The interlayer dielectric can be patterned and etched to form vias to the source metal contacts.

While various embodiments of the disclosure have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus, the breadth and scope of embodiments of the present invention should not be limited by any of the above-described exemplary embodiments.

It will be appreciated that, for clarity purposes, the above description has described embodiments of the disclosure with reference to different functional units and processors. However, it will be apparent that any suitable distribution of functionality between different functional units, processors or domains may be used without detracting from the disclosure. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known", and terms of similar meaning, should not be construed as limiting the item described to a given time period, or to an item available as of a given time. Instead, these terms should be read to encompass conventional, traditional, normal, or standard technologies that may be available, known now, or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to", or other like phrases in some instances shall not be read to mean that the narrower case is intended or required in instances where such broadening phrases may be absent.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A vertical fin-based field effect transistor (FinFET) device comprising:

an array of FinFETs comprising a plurality of rows and columns of active fins with source contacts;

one or more rows of first inactive fins disposed on a first set of sides of the array of FinFETs;

one or more columns of second inactive fins disposed on a second set of sides of the array of FinFETs, wherein the first inactive fins and the second inactive fins are characterized by a reduced electrical conductivity compared to an electrical conductivity of the active fins of the array of FinFETs;

an active gate region surrounding the FinFETs of the array of FinFETs; and an additional gate region surrounding the first inactive fins and the second inactive fins, wherein the active gate region and the additional gate region are formed from a same continuous gate layer, and wherein only localized sub-regions of the continuous gate layer adjacent to each of the first inactive fins and the second inactive fins are neutralized such that remaining portions of the continuous gate layer remain electrically conductive.

2. The vertical FinFET device of claim 1, wherein the first inactive fins and the second inactive fins comprise ion implanted fins.

3. The vertical FinFET device of claim 1, wherein the reduced electrical conductivity is reduced by at least 90%.

4. The vertical FinFET device of claim 3, wherein the reduced electrical conductivity is reduced by at least 99%.

5. The vertical FinFET device of claim 1, wherein the localized sub-regions are characterized by a second reduced electrical conductivity compared to a second electrical conductivity of the active gate region; and wherein the localized sub-regions comprise an ion implanted sub-regions.

6. The vertical FinFET device of claim 5, wherein the second reduced electrical conductivity is reduced by at least 90%.

7. The vertical FinFET device of claim 6 wherein the second reduced electrical conductivity is reduced by at least 99%.

8. The vertical FinFET device of claim 1, wherein:

the localized sub-regions comprise neutralized gate material formed only at portions of the continuous gate layer adjacent to the first inactive fins and the second inactive fins; and the localized sub-regions correspond to regions of the continuous gate layer exposed by a neutralization mask.

9. The vertical FinFET device of claim 1, wherein the active fins, the first inactive fins, and the second inactive fins comprise a III-N semiconductor material.

10. A method of fabricating a transistor array, the method comprising:

forming an array of FinFETs comprising a plurality of rows and columns of active fins with source contacts, wherein each of the active fins is surrounded by an active gate region;

forming one or more rows of first inactive fins disposed on a first set of sides of the array of FinFETs, wherein each of the first inactive fins is surrounded by an additional gate region;

forming one or more columns of second inactive fins disposed on a second set of sides of the array of FinFETs, wherein each of the second inactive fins is surrounded by the additional gate region;

forming a neutralization mask having openings exposing the first inactive fins, the second inactive fins, and a portion of the additional gate region; and reducing an electrical conductivity of the first inactive fins, the second inactive fins, and the portion of the additional gate region.

11. The method of claim 10, wherein reducing the electrical conductivity comprises ion implanting a dopant into the first inactive fins, the second inactive fins, and the portion of the additional gate region.

12. The method of claim 10, wherein reducing the electrical conductivity comprises performing a hydrogen plasma treatment process on the first inactive fins, the second inactive fins, and the portion of the additional gate region.

13. The method of claim 10, wherein reducing the electrical conductivity comprises reducing the electrical conductivity by at least 90%.

14. The method of claim 10, further comprising providing a III-N substrate structure comprising:

a III-nitride substrate;

a first III-nitride layer coupled to the III-nitride substrate; and a second III-nitride layer coupled to the first III-nitride layer.

15. The method of claim 14, wherein forming the array of FinFETs comprises:

forming a hard mask layer on the second III-nitride layer;

patterning the hard mask layer to form a patterned hard mask;

etching the second III-nitride layer and a portion of the first III-nitride layer using the patterned hard mask to form a plurality of trenches; and selectively regrowing a third III-nitride layer in the plurality of trenches.

16. The method of claim 10, wherein:

the active fins are characterized by a first electrical conductivity; and the first inactive fins and the second inactive fins are characterized by a second electrical conductivity less than the first electrical conductivity.

17. A vertical fin-based field effect transistor (FinFET) device comprising:

an array of FinFETs comprising a plurality of rows and columns of active fins with source contacts and characterized by a first electrical conductivity;

one or more rows of first inactive fins disposed adjacent a first set of sides of the array of FinFETs;

one or more columns of second inactive fins disposed adjacent a second set of sides of the array of FinFETs, wherein the first inactive fins and the second inactive fins are characterized by a second electrical conductivity less than the first electrical conductivity;

an active gate region surrounding the FinFETs of the array of FinFETs and characterized by a third electrical conductivity; and a neutralized gate region surrounding the first inactive fins and the second inactive fins and characterized by a fourth electrical conductivity less than the third electrical conductivity, wherein:

the second electrical conductivity is reduced by at least 90% of the first electrical conductivity.

18. The vertical FinFET device of claim 17, further comprising source contacts coupled to the active fins but not coupled to the first inactive fins or the second inactive fins.

19. The vertical FinFET device of claim 17, wherein:

the neutralized gate region comprises a plurality of localized sub-regions;

each of the plurality of localized sub-regions surround each of the first inactive fins and each of the second inactive fins; and the fourth electrical conductivity is reduced by at least 90% of the third electrical conductivity.

20. The vertical FinFET device of claim 17, wherein the active fins, the first inactive fins, the second inactive fins, the active gate region, and the neutralized gate region comprise III-N semiconductor material.

* * * * *